(12) United States Patent
Choy et al.

(10) Patent No.: US 11,989,417 B1
(45) Date of Patent: May 21, 2024

(54) COLUMN REPAIR IN A MEMORY SYSTEM USING A REPAIR CACHE

(71) Applicant: NXP USA, Inc., Austin, TX (US)

(72) Inventors: Jon Scott Choy, Austin, TX (US);
Timothy Strauss, Granger, IN (US);
Maurits Mario Nicolaas Storms, Best (NL); Christopher Nelson Hume, Franklin, TN (US); Silvia Wagemans, Den Bosch (NL)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 18/051,282

(22) Filed: Oct. 31, 2022

(51) Int. Cl.
*G06F 3/06* (2006.01)

(52) U.S. Cl.
CPC .......... *G06F 3/0611* (2013.01); *G06F 3/0629* (2013.01); *G06F 3/0673* (2013.01)

(58) Field of Classification Search
CPC ..... G06F 3/0611; G06F 3/0629; G06F 3/0673
See application file for complete search history.

(56) References Cited

U.S. PATENT DOCUMENTS

| | | | |
|---|---|---|---|
| 5,862,314 A | 1/1999 | Jeddeloh | |
| 5,920,515 A | 7/1999 | Shaik et al. | |
| 5,974,564 A * | 10/1999 | Jeddeloh | G11C 29/76 714/6.13 |
| 8,161,334 B1 * | 4/2012 | Hulbert | G11C 29/76 714/764 |
| 8,412,987 B2 * | 4/2013 | Billing | G11C 16/349 714/710 |
| 10,692,582 B2 | 6/2020 | Kim | |
| 10,984,846 B2 | 4/2021 | Ramanan et al. | |
| 2007/0002646 A1 | 1/2007 | Martin et al. | |
| 2018/0095823 A1 | 4/2018 | Fahim et al. | |
| 2018/0314595 A1 | 11/2018 | Eichmeyer et al. | |

FOREIGN PATENT DOCUMENTS

EP 3392885 A1 10/2018

* cited by examiner

*Primary Examiner* — Mark A Giardino, Jr.
(74) *Attorney, Agent, or Firm* — Joanna G. Geld

(57) ABSTRACT

A main memory includes a first plurality of input/outputs (I/Os) configured to output data stored in the main memory in response to a read access request. A first portion of the first plurality of IOs provides user read data in response to the read access request and a second portion of the first plurality of IOs provides candidate replacement IOs. Repair circuitry is configured to selectively replace one or more IOs of the first portion of IOs using one or more of the candidate replacement IOs of the second portion of IOs to provide repaired read data in response to the read access request in accordance with repair mapping information corresponding to an access address of the read access request. A static random access memory (SRAM) stores repair mapping information, and a repair cache stores cached repair mapping information from the SRAM for address locations of the main memory.

20 Claims, 12 Drawing Sheets

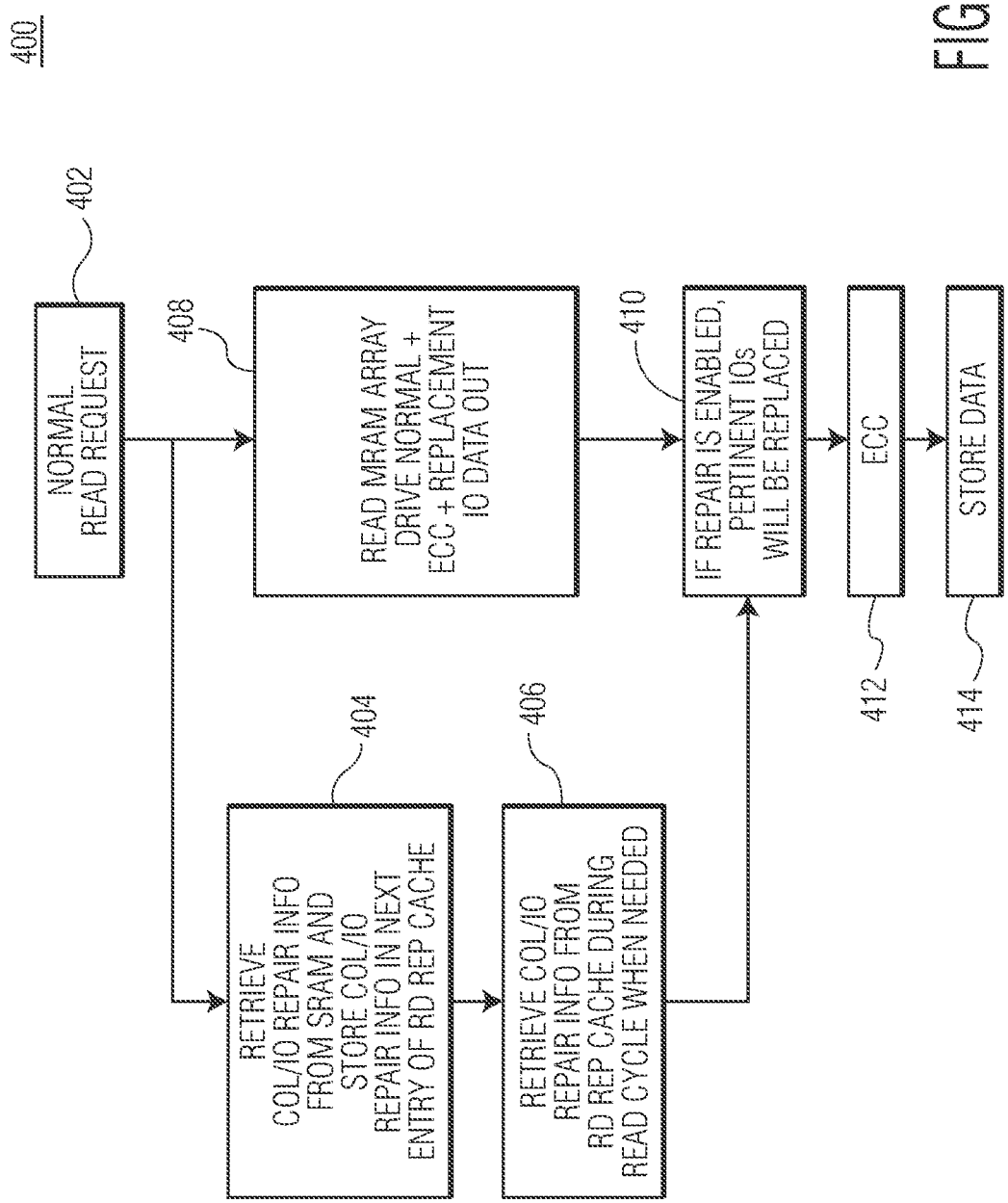

COLUMN REPAIR IN A MEMORY SYSTEM USING A REPAIR CACHE

BACKGROUND

Field

This disclosure relates generally to memories, and more specifically, to column repair in a memory system using a repair cache.

Related Art

Disruptive technologies are commonly used to implement non-volatile memories (NVMs). These NVMs can be referred to as disruptive memories and include, for example, Magneto-resistive Random Access Memories (MRAMs), Resistive RAMs (ReRAMs), Ferroelectric RAMs (Fe-RAMs), Nanotube RAMs (NRAMs), and Phase-change memories (PCMs). The bit cells of these NVMs are typically arranged in an array of rows and columns, in which the rows are addressed by corresponding word lines and the columns are addressed by corresponding bit lines. A bit cell with a corresponding storage element is located at the intersection of each row and column. A cell/column or set of cells/columns may be defective, in which replacement cells/columns can be used to perform column repair upon a read or write access to the NVM. A static RAM (SRAM) is sometimes used to compactly store the repair mapping information to perform the column repair. However, there are contention cases for accessing the SRAM to obtain the repair mapping information, such as in the case of multiple read accesses to the NVM. Therefore, a need exists for a column repair system which solves the contention issues, but without negatively impacting the size of the SRAM or utilizing a more expensive dual ported SRAM.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

FIG. 12 illustrates, in flow diagram form, a method for performing a normal read operation within the NVM system of FIG. 1, in accordance with one embodiment of the present invention.

DETAILED DESCRIPTION

Figure 1:
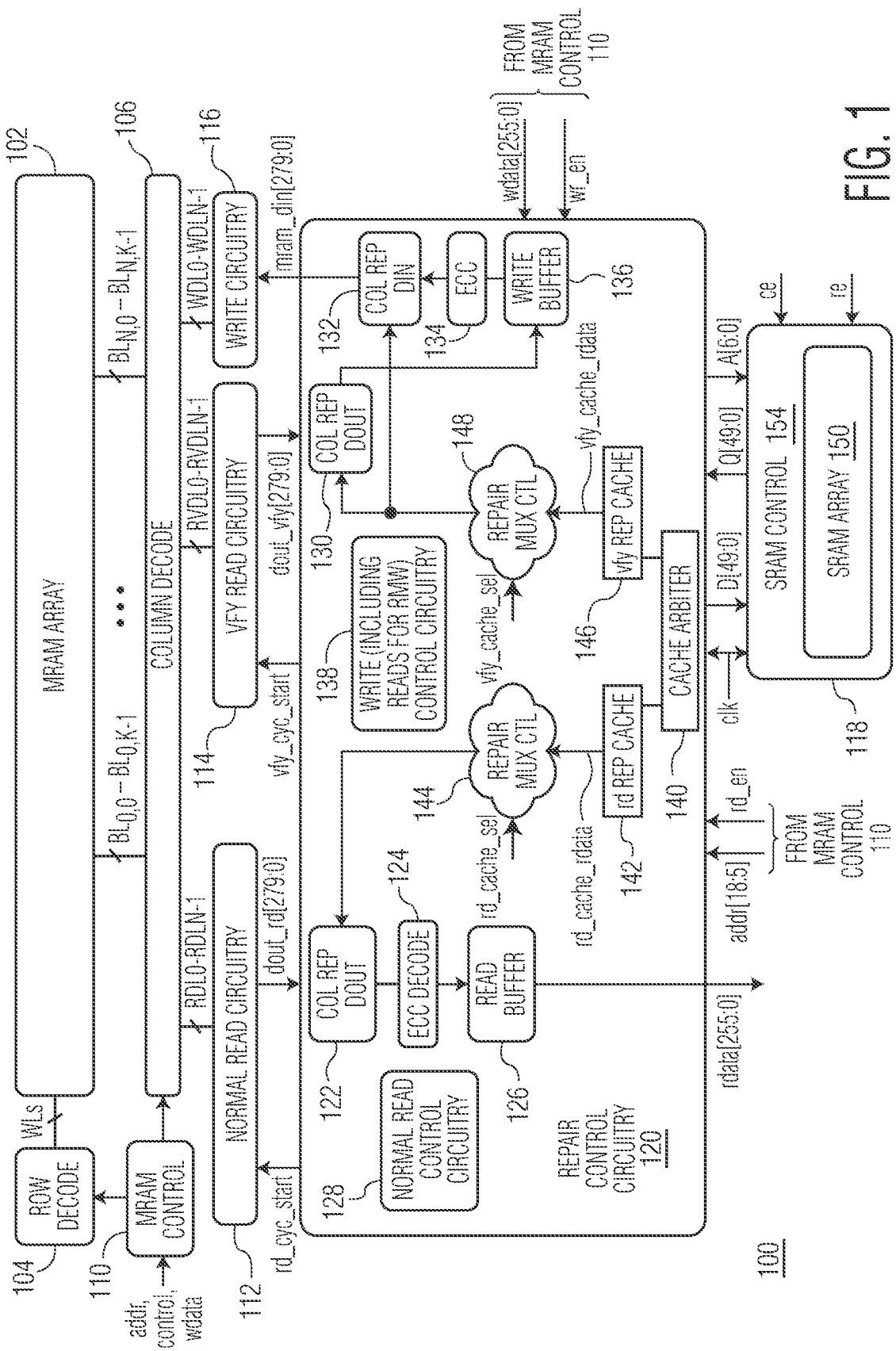
FIG. 1 illustrates, in partial schematic and partial block diagram form, an NVM system, including an MRAM and an SRAM, in accordance with one embodiment of the present invention.

A main memory (such as an NVM), as part of its data array, may also include replacement columns which can be used to replace defective columns in response to read or write accesses which access bit locations from one or more defective columns. For example, repair mapping information is used with each read access to the main memory to indicate which of the accessed columns should be instead replaced with a corresponding replacement column. In one embodiment, an SRAM is used to store this repair mapping information which can quickly be accessed upon reads to the main memory to perform the column repair. Read accesses from the SRAM can be much faster than read accesses from the main memory (such as when implemented as an NVM), therefore, the repair mapping information needed for each read access to the main memory can be readily available when needed. The number of columns which can be repaired and the granularity of each column repair is limited by the number of available replacement columns and the size of the SRAM.

Read accesses to the main memory can include normal read accesses as well as verify read accesses, in which verify read accesses are those performed during a write operation to the main memory. A normal read access is a read access request made to the main memory from a requesting device external to the main memory, in which the read operation performed by the memory in response to the read access request is not performed as a subset of a write operation. For a normal read access, the read access request is provided with a corresponding access address, and can be a single read access to obtain a single data unit as the read data in response to the read access request or a burst read access to obtain multiple data units as the read data in response to the read access request. A verify read access is a read access generated by the main memory during a write operation from the write access address of the write operation.

Column repair for read accesses to the main memory is performed for both normal read accesses as well as for verify read accesses. Therefore, the SRAM with the repair mapping information needs to be accessed for both normal accesses and verify read accesses. In one embodiment, the normal read accesses and the verify read accesses are asynchronous to each other, and can result in contention for accessing the SRAM. It is possible to double the size of the SRAM so that one portion is accessible during normal reads and a second portion during verify reads. However, increasing the SRAM is costly and undesirable in terms of circuit area and power. Another possibility is to use a dual ported SRAM to allow for simultaneous read accesses, however, this is also costly in terms of area and complexity. Therefore, in one embodiment, to address the contention issue, a verify read cache is added to service verify reads during a write operation, suppressing the need for accessing the SRAM for verify reads during the write operation. (This verify read cache can also be used for column repair for writes of the write operation.) In another embodiment, a normal read cache is also added to service normal reads. For each of the verify read cache and the normal cache, the SRAM is the backing store for the cache. In one embodiment, arbitration circuitry can be also be used to arbitrate accesses among accesses to the SRAM and the caches.

FIG. 1 illustrates, in partial schematic and partial block diagram form, a memory system having a main memory (e.g. MRAM 100) and an SRAM 118, in accordance with one embodiment of the present invention. The illustrated embodiment uses MRAM 100 as the main memory, however, alternate embodiments may use other types of NVMs, such as a different disruptive memory or a FLASH memory. Alternatively, memories other than NVMs may be used in place of MRAM 100, in which this memory may similarly be referred to as the main memory of the memory system. In the case of an MRAM, a Magnetic Tunnel Junction (MTJ) is used as the storage element (i.e. resistive element) of an MRAM cell. For example, when the magnetic moments of the interacting magnetic layers of the MTJ are aligned, a low resistance state (LRS) is stored, corresponding to a "0", and conversely, when the moments are misaligned, a high resistance is stored (HRS), corresponding to a "1". (In an alternate embodiment, the LRS can correspond to a "1" and the HRS to a "0.") Reading data stored in such memories is accomplished by sensing the resistances of memory cells and comparing the sensed resistances to a read threshold to differentiate between the LRS and HRS states, as known in the art.

MRAM 100 includes an MRAM array 102, a row decoder 104, a column decoder 106, control circuitry 110, normal read circuitry 112, verify (VFY) read circuitry 114, write circuitry 116, and repair circuitry 120. MRAM array 102 includes M rows, each having a corresponding word line, WL0-WLM-1 of WLs, and N*K columns, each having a corresponding bit line (BL). The bit lines are grouped into N groups of K bit lines, resulting in $BL_{0,0}$-$BL_{0,K-1}$ through $BL_{N-1,0}$-$BL_{N-1,K-1}$, in which each BL label is followed by two indices, the first index indicating one of the N groups and the second index indicating one of the K bit lines within the group. For example, $BL_{2,0}$-$BL_{2,K-1}$ identifies the $3^{rd}$ group of K bit lines in which, for example, $BL_{2,4}$ refers to the $5^{th}$ bit line in this $3^{rd}$ group of K bit lines. A bit cell of MRAM array 102 is located at each intersection of a word line and a bit line. Row decode 104 is coupled to the word lines, and column decode 106 is coupled between the bit lines and each of read circuitries 112 and 114 and write circuitry 116. Control circuitry 110 receives an access address (addr), corresponding control signals (control), and, for write accesses, write data, and is coupled to both row decode 104 and column decode 106. The access address for a read or write to MRAM 100 may be referred to herein as an MRAM access address or an NVM access address. Column decode 106, for a normal read access, connects a selected set of N bit lines to respective read data lines (RDL0-RDLN-1), for a verify read access, connects a selected set of N bit lines to respective read verify data lines (RVDL0-RVDLN-1), and, for a write access, connects a selected set of N bit lines to respective write data lines (WDL0-WDLN-1). Note that only bit lines are illustrated in FIG. 1, but it is understood that each bit line may also have a corresponding source line, such that each data line at the output of column decode 106 may include only a bit line, only a source line, or a bit line/source line pair, depending on the implementation of the read and write circuitries. As used herein, each bit line or source line may be referred to generically as a column line.

Normal read circuitry 112 includes a set of N sense amplifiers to read (i.e. sense) the data bit values on RDL0-RDLN-1, and outputs an N-bit read value dout_rd[N-1:0]. VFY read circuitry 114 includes a set of N sense amplifiers to read (i.e. sense) the data bit values on RVDL0-RVDLN-1, and outputs an N-bit verify read value dout_vfy[N-1:0]. Write circuitry 116 includes the appropriate bit line and source line drivers to drive a write current in the appropriate direction, based on the write data, through the selected MTJs of the write access address during a write operation. These read and write circuitries can be implemented as known in the art. Note that MRAM 100 of FIG. 1 is a simplified MRAM, having the elements needed to describe embodiments of the present invention, and may therefore include further elements and aspects not illustrated and not pertinent to the embodiments described herein. For example, as mentioned above, MRAM array 102 may also include a source line for each column (corresponding to each bit line) which may also be coupled to column decode 106, in which the source lines, like the bit lines, are coupled to the bit cells of MRAM array 102. The descriptions which follow are done with respect to the bit lines of MRAM array 102, but could apply to any column line (bit line or source line).

In operation of MRAM 100, in response to an access address for a write operation or a normal read operation, row decode 104 activates one word line (one of the WLs), based on a first portion of the access address, and column decode 106 selects one bit line from each of the N groups of K bit lines to couple to a corresponding data line of DL0-DLN-1, based on a second portion of the access address, in which the corresponding data lines may refer to RDL0-RDLN-1 for a normal read operation or WDL0-WDLN-1 for a write operation. In this manner, a particular row of bit cells of array 102, located at the intersections of the selected word line and the selected bit lines, is accessed for a read or write operation. For a normal read operation, read data is returned on a read bus (rdata), and for a write operation, write data is provided by MRAM control circuitry 110 onto a write bus (wdata). For a verify read performed during a write operation, the access address used by row decode 104 and column decode 106 is the write access address of the write operation, and the corresponding data lines for the bit lines selected by column decode 106 from the N groups of K bit lines is RVDL0-RVDLN-1. Control circuitry 110 parses the access address and provides the appropriate first portion to row decode 104 and column decode 106, and can provide timing information and any other control signals, as necessary and as known in the art, for performing the writes and normal reads of array 102.

In one embodiment, column decode 106 is implemented with multiplexers (MUXes). For example, in one embodiment, for the read data lines RDL0-RDLN-1, column decode 106 includes N K-input MUXes, each MUX receiving a group of K bit lines, in which one of those K bit lines is selected as the output. For example, a first MUX can receive $BL_{0,0}$-$BL_{0,k-1}$, and connect a selected one of those bit lines, based on the second portion of the read access address, to RDL0. Similarly, a second MUX can receive $BL_{1,0}$-$BL_{1,k-1}$, and connect a selected one of those bit lines, based on the second portion of the access address, to RDL1. In this manner, a total of N MUXes provides the connections of a corresponding selected bit line to RDL0-RDLN-1, respectively. The same description applies for each of RVDL0-RVDLN-1 and WDL0-WDLN-1 as well, in which, for example, N MUXes provide connections of a corresponding selected bit line to RVDL0-RVDLN-1, respectively, and N MUXes provide connections of a corresponding selected bit line to WDL0-WDLN-1, respectively. Note that the MUXes can be implemented in any way using digital logic, as known in the art.

Note that each data line from array 102 corresponds to an input/output (IO) of MRAM 100 For example, RDL0-RDLN-1 is coupled via normal read circuitry 112 to N IOs dout_rd[N-1:0]. For example, dout_rd[0] represents an IO from array 102 which includes RDL0 and the K bit lines in the group of K bit lines corresponding to RDL0 (e.g. $BL_{0,0}$-$BL_{0,K-1}$). Each of N and K can be any integer value greater than or equal to one. In the illustrated embodiments described herein, it is assumed that N=280 and K=32. In this embodiment, each IO of dout_rd[279:0] includes a corresponding data line and 32 bit lines (i.e. 32 columns) corresponding to the data line. Similarly, RVDL0-RVDLN-1 is coupled via vfy read circuitry 114 to N IOs dout_vfy[N-1:0], and WDL0-WDLN-1 is coupled via write circuitry 116 to N IOs mram_din[N-1:0]. In this embodiment, each of these IOs includes the corresponding data line and the 32 columns corresponding to the data line. Therefore, in the illustrated embodiment, MRAM 100 includes three sets of 280 IOs: dout_rd[279:0], dout_vfy[279:0], and mram_din[279:0].

In one embodiment, some of the IOs of MRAM 100 are used as replacement IOs for column repair during read or write accesses, which may be implemented using repair control circuitry 120 and SRAM 118. In the illustrated embodiment, it is assumed that five IOs of each set of N IOs of MRAM 100 are used as possible replacement IOs. For example, the columns of $BL_{0,0}$-$BL_{0,K-1}$ through $BL_{274,0}$-$BL_{274,K-1}$ may be used to store data (e.g. user data and ECC syndrome data) of array 102, and the columns of $BL_{275,0}$-$BL_{275,K-1}$ through $BL_{279,0}$-$BL_{279,K-1}$ may be used to store replacement data. In this example, for each set of 280 IOs, IOs 275-279 can be used to replace up to five IOs of IOs 0-274 which include defective columns. For example, IOs 0-274 can refer to dout_rd[274:0] or dout_vfy[274:0] and IOs 275-279 can refer to dout_rd[279:274] or dout_vfy[279:274], respectively. Since IOs 275-279 are replacement IOs, they can be referred to as Repl 1-Repl 5, respectively. The repair mapping information (stored in SRAM 118 or caches 142 or 146) is used to determine when and how to replace an IO with a replacement IO. For example, the repair mapping information is used by repair MUX control circuitry 144 or 148 of repair control circuitry 120 to modify MUX selections in column repair dout unit (col rep dout) 122 or col rep dout 130, respectively, to implement any remapping of the IOs for dout_rd[279:0] or dout_vfy[279:0], respectively. The repair mapping information is also used to modify MUX selections in column repair din unit (col rep din) 132 to implement any remapping of IOs for mram_din[279:0]. Note that further descriptions of repair control circuitry 120 and SRAM 118 will be provided below in reference to subsequent drawings.

Figure 2:
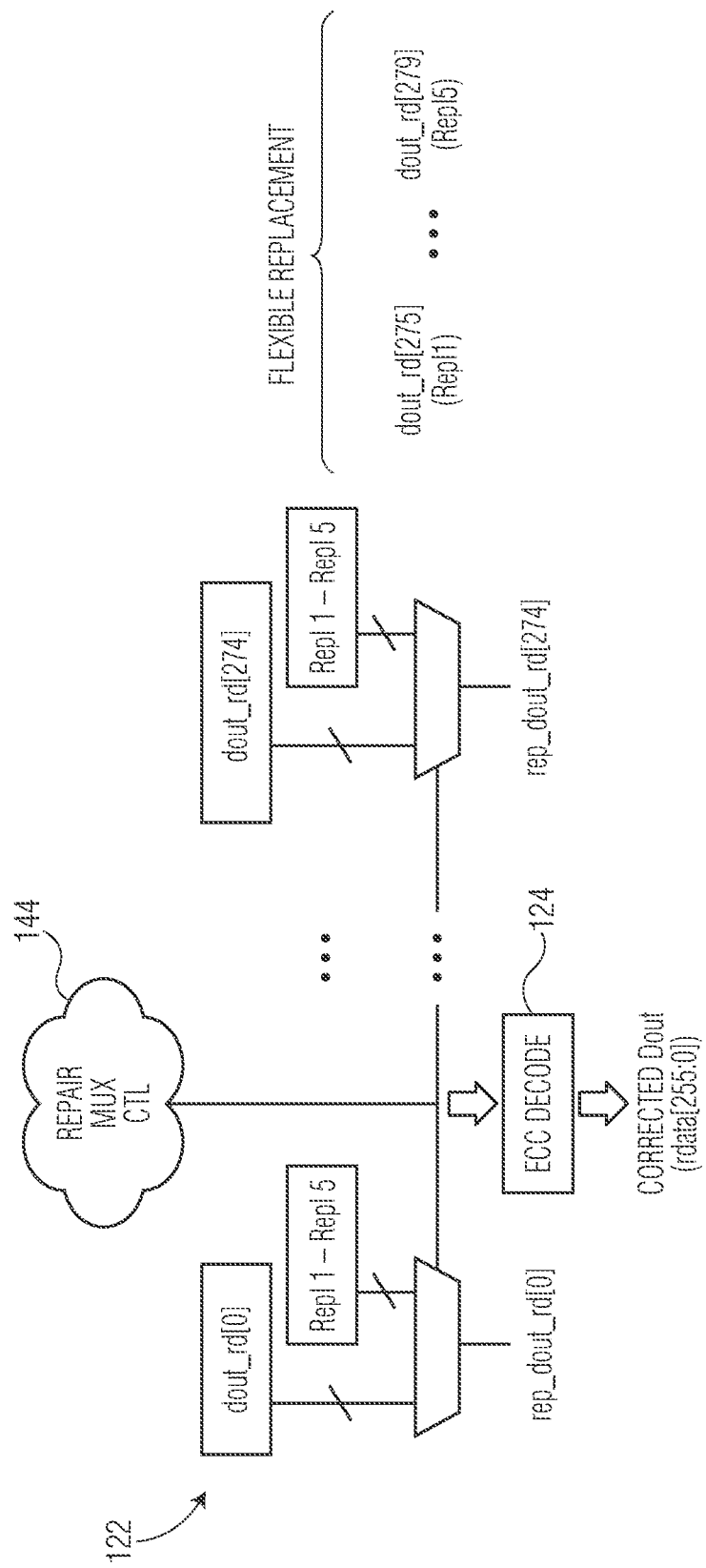
FIG. 2 illustrates, in diagrammatic form, data flow for column repair in the NVM system of FIG. 1, in accordance with one embodiment of the present invention.

FIG. 2 illustrates, in diagrammatic form, an example of col rep dout 122 for the read IOs, dout_rd[279:0], implemented using MUXes. The same description would apply for the read verify IOs, dout_vfy[279:0]. In FIG. 2, col rep dout 122 is coupled to IOs dout_rd[279:0] and outputs repaired IOs rep dout_rd[279:0]. Each of rep dout_rd[279:0] is provided as the output of a corresponding MUX. Outputs rep dout_rd[275]-rep dout_rd[279] correspond to the five possible replacement IOs (Repl1-Repl5, respectively). Each of the replacement IOs includes a corresponding data line from array 102 and the group of K bit lines (e.g. 32 columns) corresponding to the data line. For example, Repl1 (i.e. dout_rd[275]) includes RDL275 and the K bit lines corresponding to RDL275 ($BL_{275,0}$-$BL_{275,K-1}$), in which, during a read access, RDL275 is coupled to a selected one of these K bit lines. The MUXes coupled to receive dout_rd[0]-dout_rd[274], respectively, each select from the corresponding IO and any of the 5 replacement IOs to provide as a repaired output. For example, it is possible that one or more of the columns $BL_{0,0}$-$BL_{0,K-1}$ is defective, and repair mapping information indicates that dout_rd[276] (i.e. Repl2) should instead be used for a read accessing these columns rather than using dout_rd[0]. Therefore, in this case, the select signal of the corresponding MUX (e.g. the first MUX in FIG. 2) is modified by repair MUX control circuitry 144 based on the repair mapping information to select Repl2 (i.e. dout_rd[276], with RDL276 and a selected one of $BL_{276,0}$-$BL_{276,K-1}$) rather than dout_rd[0] (with RDL0 with the selected one of $BL_{0,0}$-$BL_{0,K-1}$).

In an alternate embodiment, rather than pulling in the five possible replacement IOs into each MUX corresponding to dout_rd[0]-dout_rd[274], as illustrated in FIG. 2, in which a replacement IO can be directly swapped in for a defective IO, the replacement can be implemented by shifting the columns, as needed. For example, in the case described above in which dout_rd[0] should be replaced, the MUXes can be designed to implement a left shift function of the IOs such that dout_rd[1]-dout_rd[274] are shifted down to dout_rd[0]-dout_rd[273], and the replacement IO, dout_rd[276] (Repl2), is shifted in as dout_rd[274]. Alternatively, other implementations may be used to select a possible replacement IO to replace a defective IO. Also, in the illustrated embodiment, only five of the IOs are available as possible replacement IOs, however, the array can be designed to have any number of possible replacement IOs such that more than or fewer than five are available.

Figure 3:
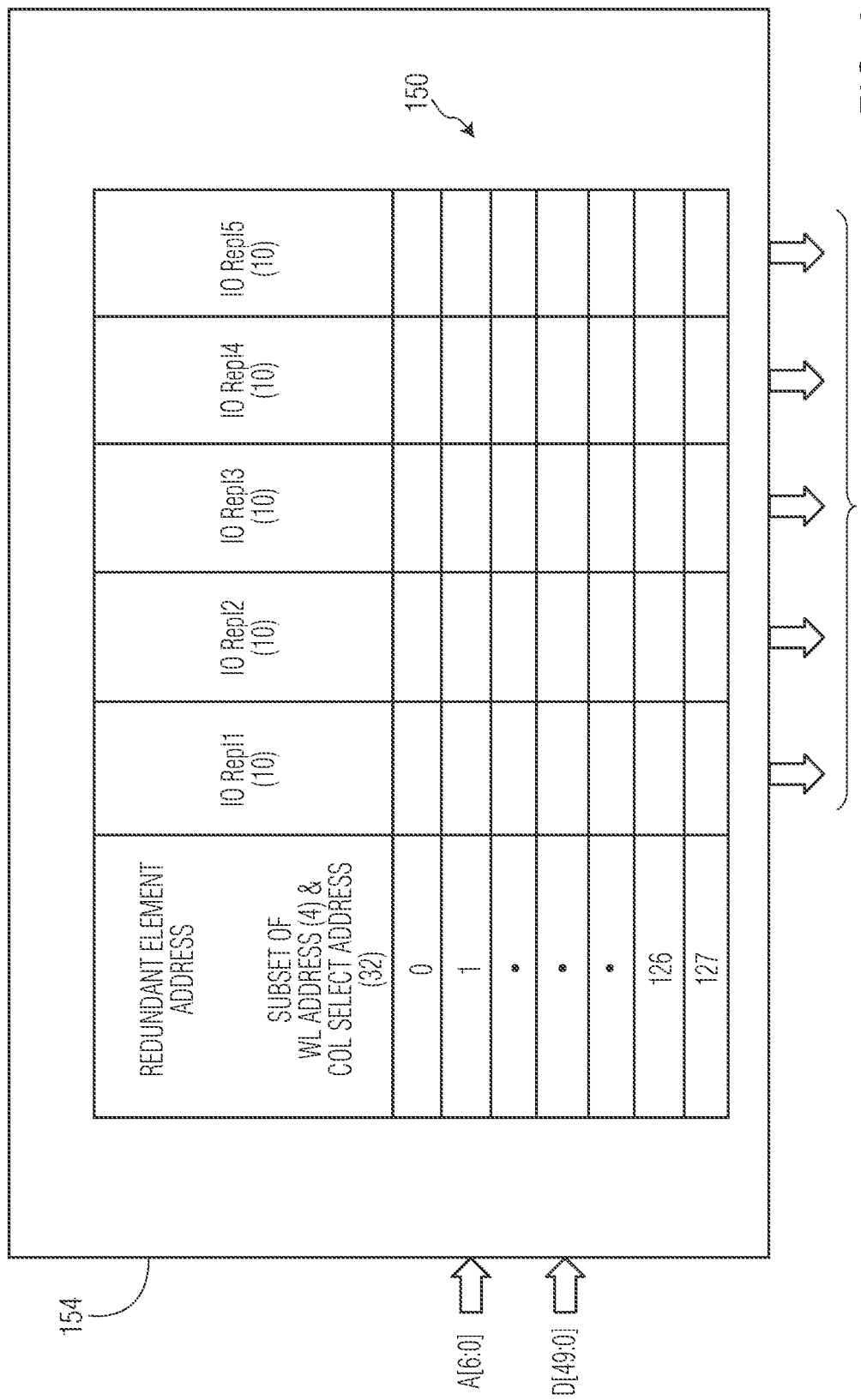
FIG. 3 illustrates, in diagrammatic form, the SRAM of FIG. 1, in accordance with one embodiment of the present invention.

FIG. 3 includes, in diagrammatic form, SRAM 118, in accordance with one embodiment of the present invention. SRAM 118 of the NVM system is used to store repair mapping information corresponding to address locations of the MRAM 100 for column replacement during accesses to MRAM 100. SRAM 118 uses a portion of the MRAM access address for a read (whether a normal read or a verify read) or a write to generate an SRAM access address corresponding to the appropriate location in SRAM 118 which stores the repair mapping information for that MRAM access address. SRAM 118 includes an SRAM array 150 which stores the repair mapping information and control circuitry 154 for performing reads and writes in SRAM array 150. In one embodiment, 7 bits of the MRAM access address is used as the access address, A[6:0], for SRAM array 150. In the case of a normal read, the MRAM access address is the read access address for the read operation, and in the case of a verify read or a write, the MRAM access address is the write access address for the write operation.

In the illustrated embodiment, each line of SRAM 118 stores 50 bits of repair mapping information, which is addressed by A[6:0]. For example, D[49:0] corresponds to repair mapping information being stored to SRAM array 150, and Q[49:0] corresponds to repair mapping information being read out from SRAM array 150. SRAM 118 can be organized differently, as needed, to store the repair mapping information, in which this information, per access, can have more or fewer bits than the 50 bits of the illustrated embodiment. Also, in alternate embodiments, depending on how the repair mapping information is stored in SRAM 118, a different portion of the MRAM access address, with more or fewer bits, can be used as the SRAM access address, or an SRAM access address can be otherwise generated from the MRAM access address.

As illustrated in FIG. 3, the SRAM address A[6:0] identifies one of the 128 addressed rows in SRAM array 150, in which this address represents a subset of the word line (WL) address as well as the column select address (i.e. addressing one bit line of the corresponding group of K bit lines). In the illustrated embodiment, assuming an MRAM read access address includes addr[18:5], in which addr[18:10] represents a 9-bit WL address portion (addressing one of M=512 WLs) and addr[9:5] represents a 5-bit column select address portion (addressing one of K=32 bit lines), the 7-bit SRAM address generated from the MRAM read access address corresponds to addr[18, 17, 9:5]. Note that using only two bits of the WL address portion covers only ¼ of the 512 rows (i.e. 128 rows). However, the size of SRAM array 150 and the portion and number of bits of the input address used to address into SRAM array 150 can be adjusted to obtain finer granularity (or coarser granularity) for identifying which IOs to replace for a given read access.

Each row (i.e. line) of SRAM array 150 stores repair mapping information for the five possible replacement IOs (Repl1-Repl5). Of the 50 bits in each row of SRAM array 150, each possible replacement IO has a corresponding set of 10 bits of repair mapping information. For example, for A=0, the retrieved SRAM data, Q[49:0], includes 50 bits. One of the 10 bits is an enable bit for the corresponding replacement IO to indicate whether or not column replacement is used for that 10. The other 9 bits for the corresponding replacement IO identifies which of the 275 IOs of MRAM 100 should be replaced with the corresponding replacement IO. In the illustrated embodiment, for any of the MRAM read access addresses mapping to A=0 (the first row), each of IO Repl1, IO Repl2, IO Repl3, IO Repl4, and IO Repl5 can be independently enabled and identify one of the 275 IOs to be replaced with the replacement IO. Each of the possible replacement IOs, which can be selectively enabled, may also be referred to as candidate replacement IOs for a particular read access. In alternate embodiments, a different number of bits may be used to store the remapping information for each possible replacement 10.

Referring back to FIG. 1, repair circuitry 120 of the NVM system includes circuitry and corresponding control circuitry for performing reads and writes in MRAM array 102, in which column repair is implemented for read and write accesses. For normal reads, a read access request with a corresponding read access address, addr, is provided to MRAM control 110, and the read enable control signal, rd_en, is asserted by MRAM control 110 to indicate a normal read operation. In one embodiment, the rd_en signal remains asserted throughout the normal read operation. MRAM control 110 provides the appropriate address values to row decode 104, column decoder 106, and SRAM control 154, and can also apply control signals, as needed, to any portion of the NVM memory system. For the read operation, read circuitry 112, upon assertion of the rd_cyc_start signal, senses the bit values at the intersection of the selected word lines and bit lines (as addressed by the corresponding read access address) by sensing RDL0-RDLN-1 and outputs the read data as dout_rd[279:0]. In this example, dout_rd[279:0] includes 280 bits, including 256 bits corresponding to the user data being accessed from array 102, 19 bits corresponding to the corresponding ECC data (i.e. the syndrome bits for ECC), and 5 bits of replacement data (i.e. the 5 possible replacement IOs). Note that this is only an example of the bit storage in each line of array 102. In alternate embodiments, each of the user data being accessed, the corresponding ECC data, and the replacement data can be a different number of bits, as needed. In one embodiment, ECC may not be used, meaning there would be no need to store any syndrome bits in array 102.

The read data from normal read circuitry 112 is provided to column rep dout 122, then to ECC circuitry 124, and finally to read buffer 126 to store the final 256-bit unit of read data as rdata[255:0]. As illustrated in the data flow of FIG. 2, column rep dout 122 receives the sensed (raw) read data from array 102 as dout_rd[279:0] (which includes the 5 possible replacement IOs, dout_rd[279:274]. The raw data corresponds to the user data+ECC data+replacement data, i.e. the read data that has not yet been column repaired nor ECC corrected. The appropriate repair mapping information is retrieved from SRAM 118 corresponding to the access address. This repair mapping information is provided to repair MUX control circuitry 144, which is coupled to col rep dout 122. Col rep dout 122 provides the repaired read data (the read data using the appropriate replacement columns) as rep dout_rd[274:0]. In this example, each of the possible replacement IOs for the access address is, when enabled, provided as the replacement IO, in which the corresponding read output bit of the replacement IO is provided instead of the identified 10 being replaced. (Alternatively, as described above, the replacement IOs can be shifted in, overwriting the defective IOs.)

The repaired read data is provided to ECC unit 124 to provide ECC correction using the corresponding syndrome bits of rep dout_rd[274:0], and thus provide the corrected (and repaired) read data for storage to read buffers 126 (see FIG. 2). Therefore, read buffers 126 hold rdata[255:0] which can be provided back to the requesting device in response to the normal read access. (Note that rdata may also refer to the read bus on which the read data is communicated.) The timing and any control information for performing the normal read can be provided by normal read control circuitry 128. Note that if ECC is not being used, the raw read data and repaired read data may include fewer bits since there would be no corresponding syndrome bits needed.

As described above, verify reads are reads which are performed during write operations. For a write operation to MRAM array 102, write data is provided with the write request and corresponding write access address, addr, to MRAM control 110. MRAM control 110 provides the appropriate address values to row decode 104, column decoder 106, and SRAM control 154, and can also apply control signals, as needed, to any portion of the NVM memory system. In the illustrated embodiment, the write data is a 256-bit unit of user data provided by MRAM control 110 as wdata[255:0] to write buffer 136. (Note that wdata may also refer to the write bus on which the write data is communicated.) MRAM control circuit 110 asserts the write enable control signal, wren. In one embodiment, wren remains asserted for the duration of the write operation, even when verify reads are occurring during the write operation. Assuming ECC is being used, the write data is provided to ECC unit 134 which generates corresponding syndrome bits (e.g. 19 syndrome bits in the illustrated embodiment). This information is provided to col rep din 132. As will be described further below, column repair unit 132 uses corresponding repair mapping control information to properly generate the values for the 5 replacement IOs. Therefore, col rep din 132 provides the full 280 bit value as mram_din [279:0] for writing into the selected bit cell locations addressed by the write access address. This is done by driving the appropriate write currents onto the selected source lines and selected bit lines corresponding to mram_din[0]-mram_din[N-1], which are repaired in like manner to dout_vfy[0]-dout_vfy[N-1].

Figure 7:
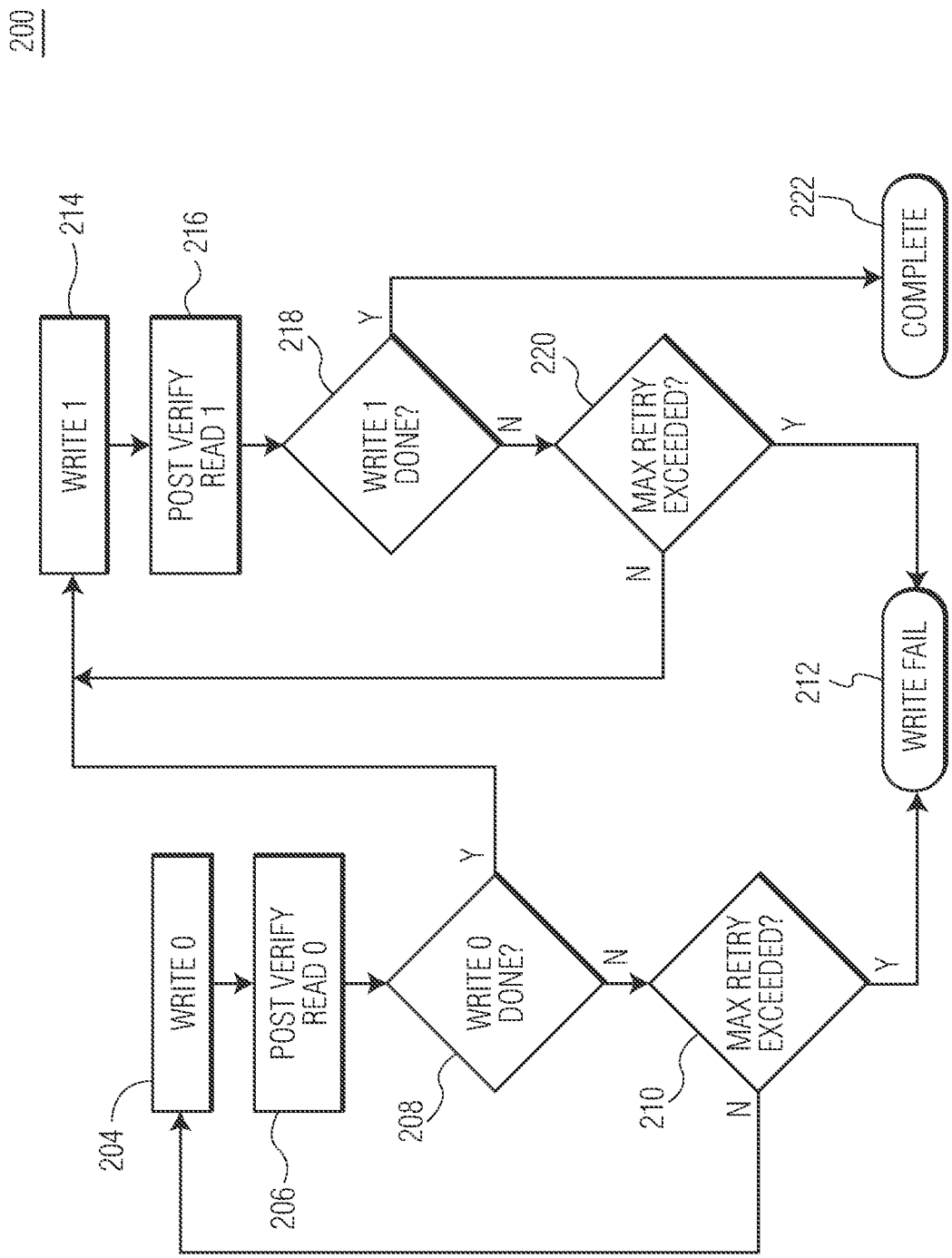
FIG. 7 illustrates, in flow diagram form, a method of performing a write operation, in accordance with an embodiment of the present invention.

FIG. 7 illustrates, in flow diagram form, a method 200 for performing a write operation which includes verify read operations, in accordance with one example, in which method 200 can be implemented by write control circuitry 138 of FIG. 1, along with VFY read circuitry 114 and write circuitry 116. Method 200 begins with a write 0 performed at block 204 in which the 0s are written first to the write access address. For the write 0s, one or more write pulses can be provided with a write current in a first direction to those bit locations of the write location needing to be 0. After these write pulses, a post verify read of the write access address is performed at block 206 to verify the 0s. This verify read is performed to determine if 0s were actually written to the appropriate bit locations of the write location. If the write pulses were sufficient to write the 0s, then, at decision diamond 208, the write 0 is determined to be complete, and the write 1s are performed next at block 214 in which one or more write pulses are provided with a write current in a second, opposite, direction to those bit locations of the write location needing to be a 1.

If the write 0 was not complete at decision diamond 208, method 200 proceeds to decision diamond 210 where it is determined if a maximum number of retries has been exceeded. The maximum number of retries may be determined in a variety of different ways, such as, for example, based on a maximum number of write pulses, a maximum duration of write pulses, a maximum write voltage level has been exceeded, or the like. If the maximum number of retries has been exceeded, the write has failed at block 212. If not, then method 200 returns to block 204 in which a subsequent write 0 is again performed to the write access address. This write 0 can use a same or different number of write pulses as was previously tried, or may be done using a higher current.

At block 214, after the write 1 is performed, a post verify read of the write access address is performed to verify the 1s. This verify read is performed to determine if 1s were actually written to the appropriate bit locations of the write location. If the write pulses were sufficient to write the 1s, then, at decision diamond 218, the write 1 is determined to be complete, thus completing the write operation at block 222. If, at decision diamond 218, the write 1s was not successful, it is determined, at decision diamond 220, whether the maximum number of retries has been exceeded, similar to what was determined in at decision diamond 210. If the maximum number has been exceeded, then the write has failed at block 212. If not, then method 200 returns to block 214 in which a subsequent write 1 is again performed to the write access address. The write 1 can use a same or different number of write pulses as was previously tried, or may be done using a higher current. Note that in alternate embodiments, the write 1s can be performed prior to the write 0s. Therefore, it can be seen for a single write operation, multiple verify reads are performed, each close in time and from a same write access address. Other write operations may also include verify reads during the write operation, or may be performed differently than illustrated in FIG. 7. The use of column repair for verify reads described herein, though, can apply to any verify read.

Referring back to FIG. 1, for verify reads, VFY read circuitry 114, upon assertion of the vfy_cyc_start signal (which occurs during a write operation), senses the bit values at the intersection of the selected word lines and bit lines (as addressed by the corresponding write access address) by sensing RVDL0-RVDLN-1 and outputs the raw verify read data as dout_vfy[279:0]. As with the normal read described above, in this example, dout_vfy[279:0] includes 280 bits, including 256 bits of user data (corresponding to the data unit being written to array 102), 19 bits corresponding to the syndrome bits for ECC, and 5 bits of possible replacement IOs. Note that, as with the normal read, this is only an example of the bit storage in array 102. In alternate embodiments, each of the user data being accessed, the corresponding ECC data, and the corresponding replacement data can be a different number of bits, as needed. In the case in which ECC is not used, there would also be no syndrome bits.

Analogous to the normal read data, in the case of a verify read, the sensed (raw) read data dout_vfy[279:0] from VFY read circuitry 114 is provided to column repair dout unit 130 for repair. The appropriate repair mapping information is also retrieved from SRAM 118 corresponding to the access address. This repair mapping information is provided to repair MUX control circuitry 148, which is coupled to column repair dout unit 130. Repair MUX control circuitry 148 is analogous to repair MUX control circuitry 144 and implements any of the 10 remapping indicated by the repair mapping information for the verify read. Column repair dout unit 130 generates the repaired read data (the read data using the appropriate replacement IOs, but not yet ECC corrected) as rep dout_vfy[274:0]. As with a normal read, each replacement 10 for the access address is, when enabled, provided as the corresponding read output bit for the identified 10 being replaced or, alternatively, is shifted in while the IOs being replaced are overwritten. (Note that this operation is analogous to the data flow illustrated in FIG. 2 for a normal read in which dout_rd[0]-dout_rd[279] in FIG. 2 would instead correspond to dout_vfy[0]-dout_vfy[279] to obtain rep dout_vfy[0]-rep dout_vfy[274].)

The user data portion (rep dout_vfy[255:0]) of the repaired data (rep dout_vfy[274:0]) is provided for storage as write data into write buffer 136. This write data can then be written back to array 102 from write buffer 136, as was described above in reference to wdata[255:0] received and stored in write buffer 136. That is, the write data in write buffer is provided to ECC 134 and then col rep din 132 (which can use the corresponding repair mapping information from vfy rep cache 146) to generate mram_din[279:0] to write circuitry 116. The timing and any control information for performing the write operation, including the verify reads, can be provided by write control circuitry 138.

In the descriptions of FIGS. 1-3, a specific example of performing column repair has been provided by modifying the MUXing operation of column decode 106 for read accesses. The repair mapping information provides information as to how to map any of the possible replacement IOs to replace a defective IO for a read access. Alternate embodiments may use different circuitry to implement col rep dout 122 or 130 or col rep din 132 and therefore, may use different repair control circuitry (in place of repair MUX control circuitry 144 and 148) to implement the enabling and mapping of the possible replacement IOs for each read access. Similarly, the repair mapping information provided for each read access may be presented in a different format, with a different number of bits, to indicate a corresponding mapping of the possible replacement IOs (i.e. candidate replacement IOs) for the read access which is implemented by the repair control circuitry to generate the repaired read data (e.g. rep dout_rd, rep dout_vfy). Also, the NVM of the NVM system may include any number of candidate replacement IOs, which may be stored within the NVM as described in reference to the example of FIG. 1, or which may be stored in a separate NVM array.

As has been described for the NVM system of FIG. 1, both normal reads, verify reads, and writes require access to SRAM 118 to obtain corresponding repair mapping information. Further, the verify reads are typically performed multiple times during a single write operation, each close in time and typically from a same write access address. Therefore, repair circuitry 120 also includes a read repair (rd rep) cache 142 for use with normal reads and a verify read repair (vfy rep) cache 146 for use for verify reads (in which the retrieved repair mapping information is also made available for subsequent write pulses of a write operation). SRAM 118 is the backing store for both of these caches. Each of these caches can include any number of entries, as needed, based on the desired implementations, in which the entries of the caches store recently used remapping information obtained from SRAM 118, in order to reduce contention for the SRAM. In one embodiment, only vfy rep cache 146 is used for SRAM 118, in which case, rd rep cache 142 would not be present. A cache arbiter 140 is used to arbitrate accesses to SRAM 118. The use of caches 142 and 146 will be described in reference to the flow diagrams of FIGS. 8, 9, and 12, as well as the example waveforms.

Figure 8:
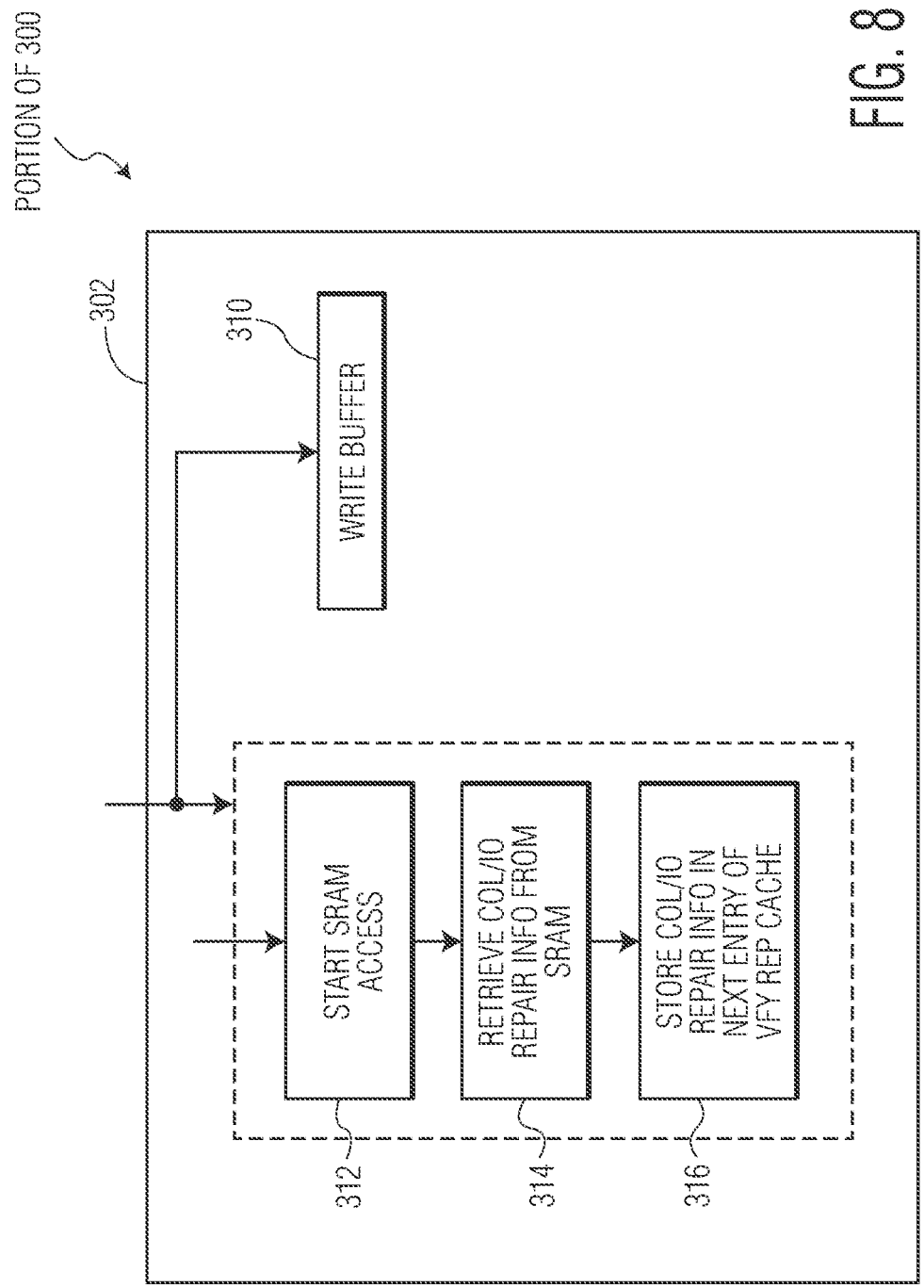
FIGS. 8 and 9 illustrate, in flow diagram form, a method of performing a write operation which includes a verify read operation within the NVM system of FIG. 1, in accordance with one embodiment of the present invention.
Figure 9:
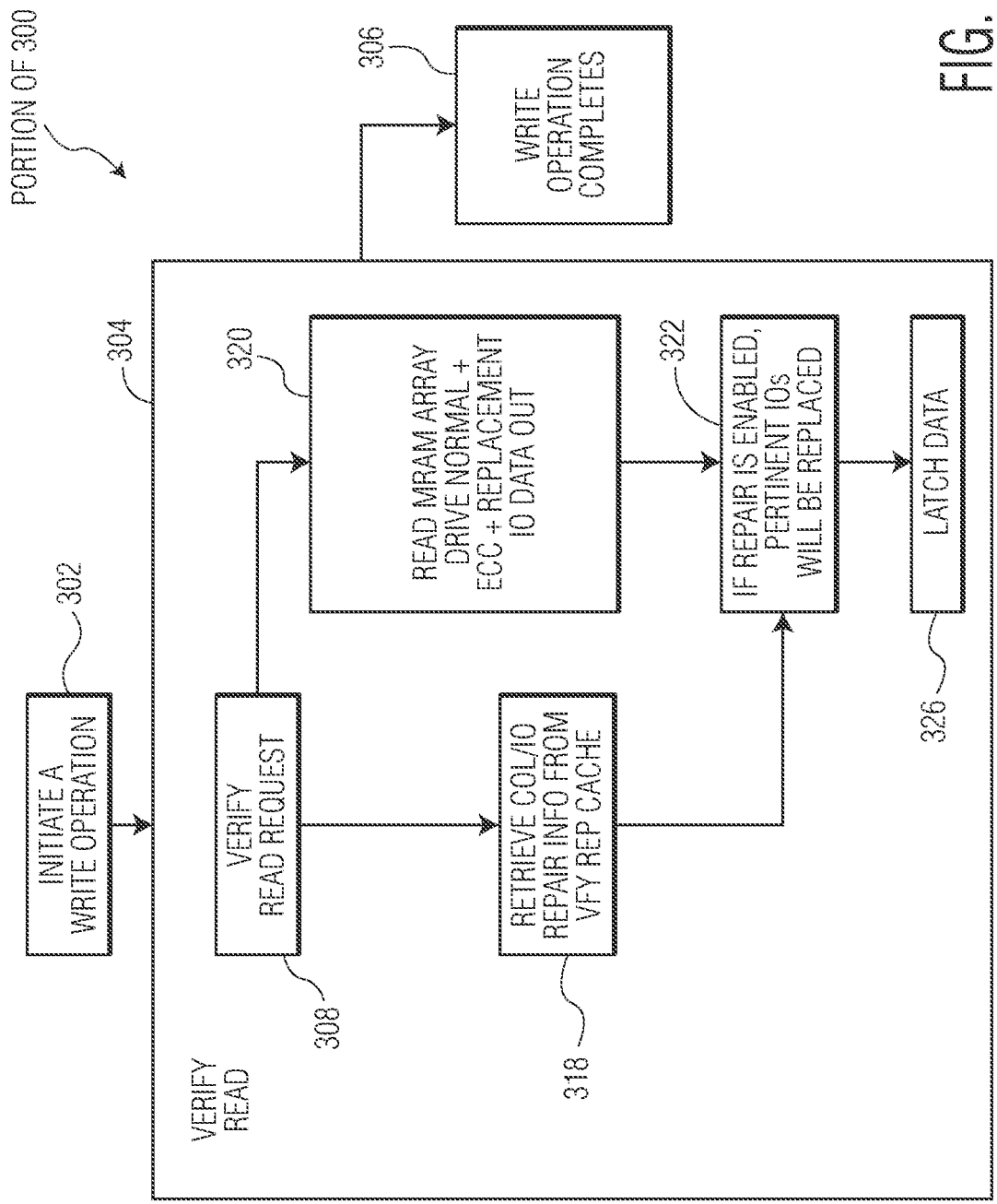

Referring first to vfy rep cache 146, FIGS. 8 and 9 illustrate a method 300 for performing a write operation with verify reads, in which column repair is implemented utilizing SRAM 118 and vfy rep cache 146. Method 300 can be implemented and controlled by write control circuitry 138. For example, write control circuitry 138 can implement a state machine for these write operations. For ease of explanation, in the illustrated example, it is assumed there is no rd rep cache 142 or that arbiter 140 prioritizes vfy rep cache 146 over rd rep cache 142. Method 300 begins with block 302 with the initiation of a write operation which includes verify reads, in which the read access address for the verify reads is the write access address of the write operation. Block 302 includes the operations of blocks 310, 312, 314, and 316. In response to the initiation of a write operation, the write data (wdata[255:0]) of the write operation is written to write buffer 136 in block 310, and an access to SRAM 118 is initiated in block 312. For the SRAM access, a portion (e.g. A[6:0]) of the corresponding verify read access address (corresponding to the write access address), is used to retrieve the repair mapping information from SRAM 118. In block 314, the repair mapping information is returned as Q[49:0] from SRAM 118. This information is provided to repair MUX control 148 to be used by column replacement dout unit 130. At block 316, the retrieved repair mapping information is stored into a next available entry of vfy rep cache 146.

In FIG. 9, continuing with the write operation initiated in block 302, a verify read operation is performed in block 304, which includes the operations of blocks 308, 310, 318, 320, 322, and 326. In block 308, a verify read request is generated as part of the write operation. The verify read access address for the verify read request is the write access address of the write operation. Since a read from SRAM 118 to load mapping information into vfy rep cache 146 was initiated back with the initiation of the write operation, it is known that, by the time the verify read request is generated, the repair information is already stored in vfy rep cache 146. Therefore, at block 318, the corresponding repair mapping information is obtained from vfy_cache 146 as vfy_cache data[49:0], and no access to SRAM 118 is needed at that time. As will be seen in the example waveforms to be described below, this reduces contention for SRAM 118 since SRAM 118 remains available to service other requests for repair information, such as those made during normal reads.

Referring back to block 308, after initiating the verify read request, a read to MRAM array 102 is performed (in block 320) by vfy read circuitry 114 in response to the verify read request, which results in dout_vfy[279:0] being provided to column repair dout unit 130. As previously described, this includes sensing the raw read data, including the user data, ECC data, and replacement data from array 102. Note that the access to MRAM array 102 is performed simultaneously to obtaining the repair mapping information from SRAM 118 or vfy rep cache 146. Afterwards, at block 322, the repair mapping information, obtained from vfy rep cache 148 at block 318, is used to determine if column repair is enabled, and if so, replace the pertinent IOs with the corresponding replacement IOs. Since read accesses to SRAM 118 and vfy rep cache 148 are faster than read accesses to MRAM 100, the required repair mapping information for the MRAM read access is ensured to be available by the end of the MRAM read access (for block 322). At this point, at block 326, the column-repaired read data (from col rep dout 130, prior to performing ECC) is latched (i.e. stored) for use, as needed, in performing the write operation (such as to compare to the desired write data for the verify read). Block 304 is one of the verify reads performed in the write operation, which may include many more verify reads, as was described in reference to FIG. 7. Therefore, after block 304, the write operation continues as needed with writes and verify reads and completes at block 306.

Figure 4:
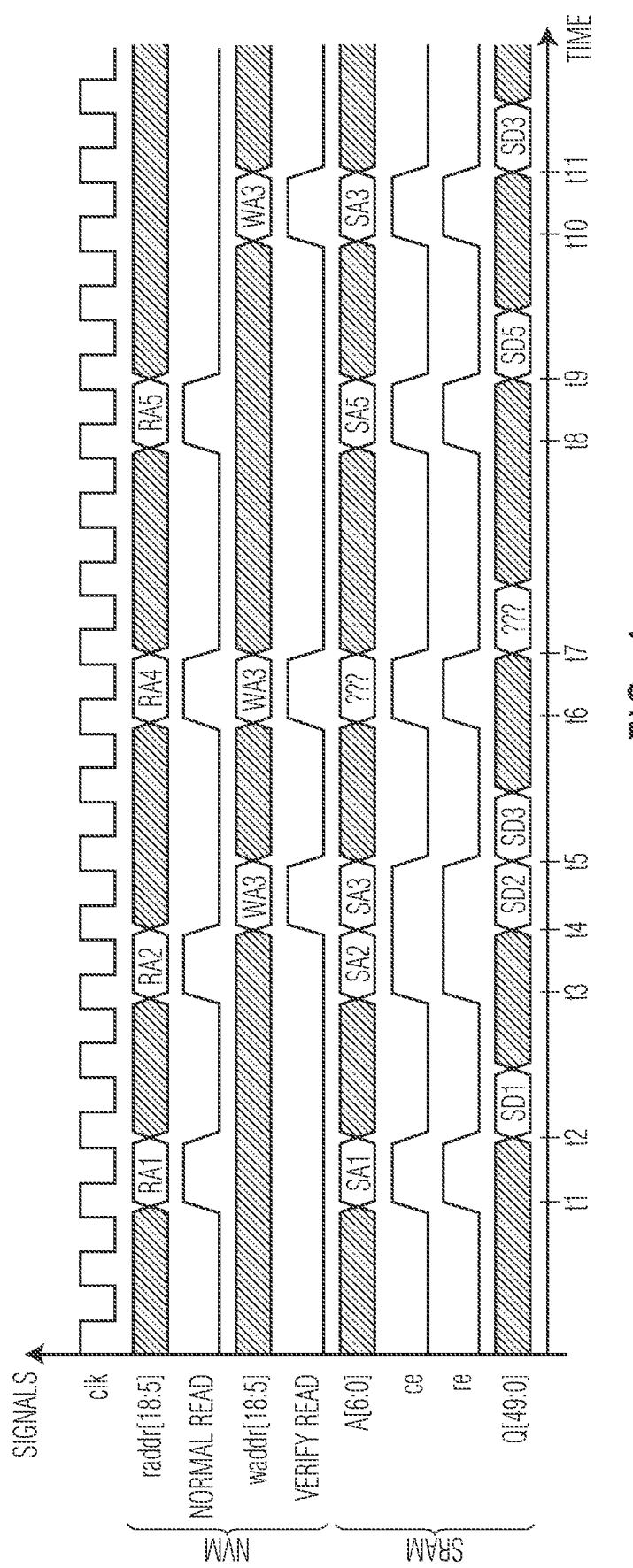
FIGS. 4-6 illustrate waveform diagrams of various signals of the NVM system of FIG. 1, in accordance with embodiments of the present invention.
Figure 5:
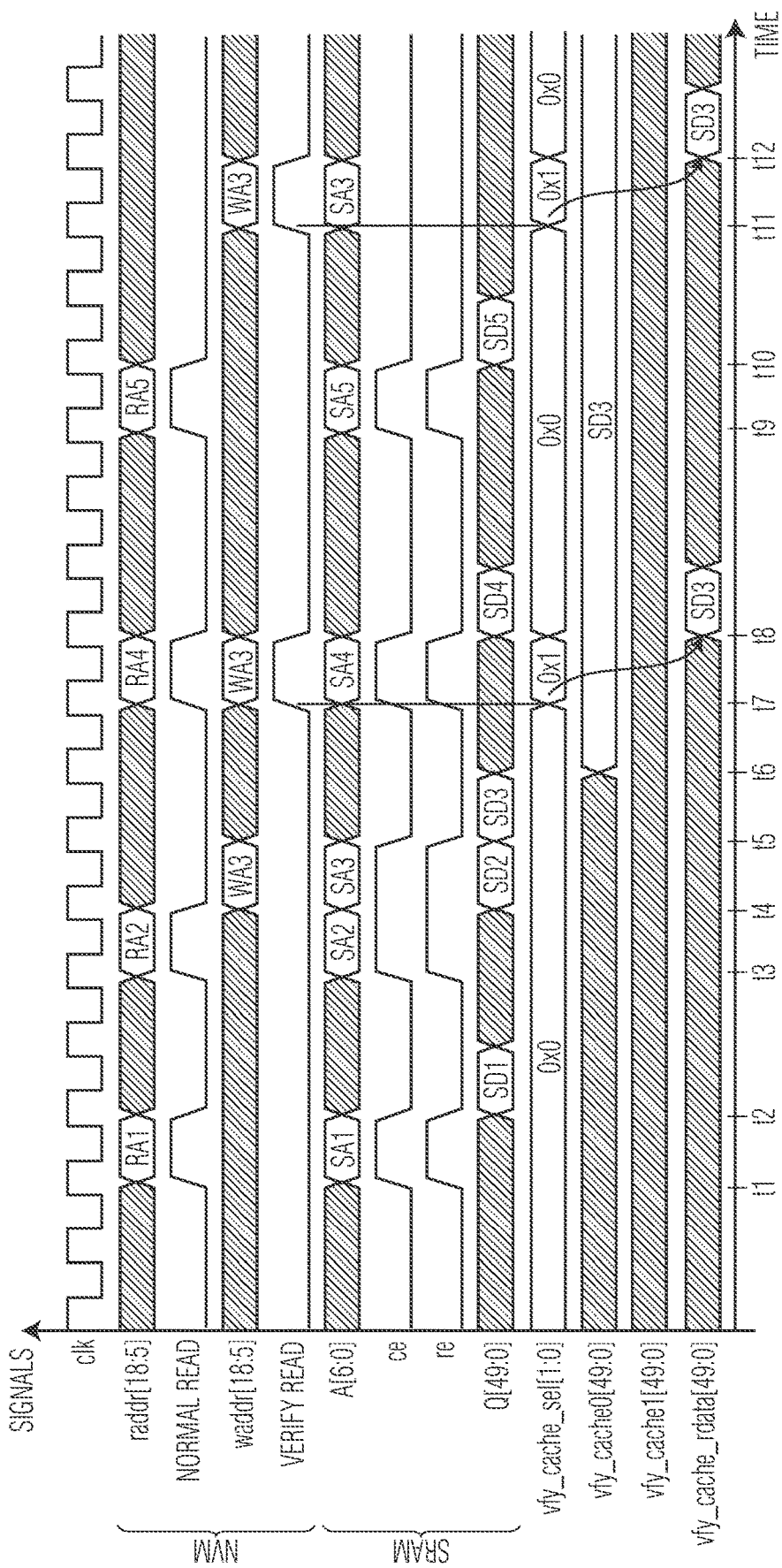
Figure 6:
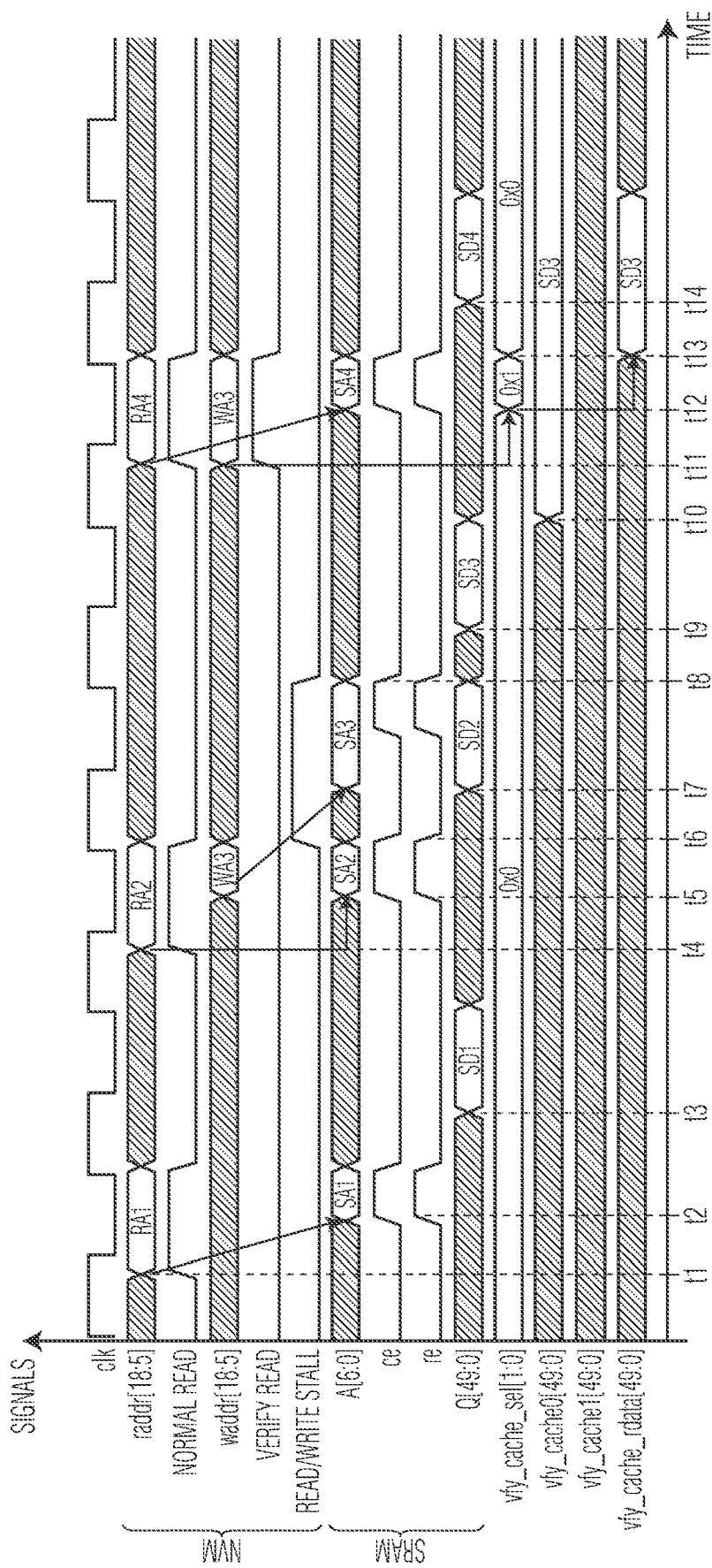

FIGS. 4-6 illustrate waveforms of various signals within the NVM system of FIG. 1, in accordance with various examples. FIGS. 4-6 illustrate a set of signals corresponding to an NVM (which corresponds to MRAM 100 in the illustrated example, but could be any NVM of the NVM system), and to an SRAM (which corresponds to SRAM 118). Control signals indicating when an NVM access address (e.g. MRAM access address) corresponds to a normal read versus a verify read is illustrated in FIGS. 4-6, which can be generated and provided by MRAM control 110. Other control signals include a chip enable signal (ce) indicating when SRAM 118 is being accessed and a read enable signal (re) for writes to SRAM 118. These can also be provided by MRAM control 110, or can be provided by control circuits 128 and 138 as part of repair circuitry 120. A portion of the NVM access address for any read (verify read or normal read) is provided as raddr[19:5] (as described in the example of FIG. 3 above and used to generate A[6:0]).

In the illustrated waveforms, "RAx" indicates a received NVM read access address, in which the number for x is simply used to distinguish between different read access addresses. Similarly, "WAx" indicates a received NVM write access address, in which the number for x again is used to distinguish between different write access addresses. "SAx" indicates SRAM read access addresses provided to SRAM 118, and "SDx" refer to the repair mapping information (e.g. the value of Q[49:0]) received from SRAM 118, in which the number for x differentiates between different SRAM read accesses. When the numbers following SA and SD match, they refer to transactions of the same read access. For example, SD1 corresponds to the returned repair mapping information stored at SA1 in SRAM 118.

FIG. 4 illustrates various signals in accessing MRAM 100 and SRAM 118, in an example in which there is no vfy rep cache and no rd rep cache. A first NVM normal read access request with NVM access address RA1 is received by MRAM 100 at time t1. Normal Read (an active high signal) is asserted high to indicate the normal read access. A corresponding portion of the NVM access address is provided as the SRAM access address (SA1 on A[6:0]) to SRAM 118 for an SRAM read access to obtain the corresponding repair mapping information. Along with SA1, ce (an active high signal) is asserted high to select/enable SRAM 118, and re (also an active high signal) is asserted high to indicate a read operation. At time t2, the repair mapping information is provided by SRAM 118 as SD1. This information is used by repair circuitry 120, as described above, to implement column repair for the NVM read access from RA1. Subsequently, at time t3, a second NVM normal read access request with NVM access address RA2 is received by MRAM 100 (as indicated by the assertion of Normal Read). At time t3, a corresponding portion of the NVM access address is provided to SRAM 118 as the SRAM access address SA2, and ce and re are also asserted. The corresponding remapping information SD2 is returned at time t4. (Note that in the descriptions which follow, a read or write request can simply be referred to by its read access address RAx/SAx or write access address WAx, respectively.)

At time t4, the next clock cycle after the normal read request RA2 is received, an NVM verify read request is received (i.e. generated within MRAM 100 during a write operation) with write access address WA3. Note that WA3 is the access address for the write operation, and is provided on the write address bus as waddr[18:5], which, as illustrated in the embodiment of FIG. 1, is separate from the read access bus. At time t4, the corresponding portion of the access address for this verify read is provided to SRAM 118 as the SRAM access address SA3 to obtain the corresponding repair mapping information, and ce and re remain asserted. The repair mapping information SD3 is returned at time t5. Note that the verify read request from WA3 will likely be repeated since it corresponds to one of the verify reads during the write operation, and typically, such a write operation includes multiple verify reads from the write access address.

At time t6, both a normal read access request (with access address RA4) and a verify read access request (with access address WA3) are received. This second verify read request is to the same address location, WA3, as the previous verify read request. Both read requests, though, require corresponding repair mapping information from SRAM 118. However, a decision needs to be made as to which read access request to service first. Since SRAM 118 is only a single port memory, only one read address can be provided on A[6:0] at time t6. Regardless of which is provided, one of the two read accesses would need to be delayed. In the illustrated embodiment, if the normal read request is serviced first, SA4 will be provided to SRAM 118, rather than SA3, at time t7. However, with a cache in place, such as vfy rep cache 146, the repair mapping information for the verify read request WA3 can be obtained from the cache (since the repair mapping information is loaded from SRAM 118 into the cache upon initiation of the write operation, which occurred earlier in time), while the repair mapping information for the normal read request RA4 can be obtained from SRAM 118. That is, read access to the cache can be performed simultaneously with access to SRAM 118 thus preventing contention for access to SRAM 118.

Referring back to FIG. 4, another NVM normal read access request (with NVM access address RA5) is received at time t8, with its corresponding repair mapping information SD5 returned from SRAM 118 at time t9. Next, at time t10, another verify read request with access address WA3 is received, and the corresponding repair mapping information is returned as SD3 again from SRAM 118 at time t11. In this case, due to the lack of a vfy rep cache, SRAM 118 needs to be accessed again to obtain SD3 even though it was already obtained in response to a previous verify read.

FIG. 5 illustrates various signals in access MRAM 100 and SRAM 118, in an example in which vfy rep cache 146 is present for SRAM 118 for use by repair circuitry 120. In addition to the signals illustrated in FIG. 4, the waveform of FIG. 5 also illustrates signals for vfy rep cache 146. In this embodiment, the signals vfy_cache0[49:0] and vfy_cache1[49:0] correspond to two data entries (i.e. two lines) of vfy rep cache 146. The select signal, vfy_cache_sel[1:0], is a 2-bit value which identifies when vfy rep cache 146 is selected for verify cache read as well as which entry is selected (e.g. when vfy_cache_sel[1:0]=0x1, vfy_cache0[49:0] is selected and when vfy_cache_sel[1:0]=0x2, vfy_cache1[49:0] is selected). Note that, as used herein, a number preceded with "0x" indicates that the number is in hexadecimal format. Note also that vfy rep cache 146 can include any number of entries, as needed, and vfy_cache_sel signal can include any number of bits, as needed. The read data output from an entry of vfy rep cache 146 is provided as vfy_cache rdata[49:0].

The signals for MRAM 100 and SRAM 118 illustrated at times t1-t4 in FIG. 5 are the same as the example of FIG. 4. Therefore, all the descriptions provided above with respect to operation of MRAM 100 and SRAM 118 for the events up until time t6 also apply to the events of FIG. 5. That is, NVM normal read requests RA1 and RA2 are received at times t1 and t3, respectively, in which the corresponding portions (SA1 and SA2, respectively) of the access address are also provided to SRAM 118. The corresponding repair mapping information, SD1 and SD2, respectively, are returned from SRAM 118 at times t2 and t4, respectively. Since RA1 is for a normal read access and not a verify read access, vfy rep cache 146 is not accessed, therefore, vfy_cache_sel[1:0] remains at zero. Also, at time t1, since no verify read requests have been received yet, vfy rep cache 146 is empty, in which each entry includes no valid data (no valid repair mapping information).

In the example of FIG. 5, at time t4, an NVM write request for a write operation is received (with a corresponding write access address WA3). Upon initiation of this write operation, corresponding write data (wdata) is stored into write buffer 136, and SRAM 118 is accessed to obtain the corresponding repair mapping information (SD3). Therefore, at time t4, the corresponding portion of the write access address is provided to the SRAM as SA3 on A[6:0]. SRAM 118, at time t5, returns the corresponding repair mapping information SD3 which is loaded into the next available entry, vfy_cache0[49:0], at time t6.

At time t7, both an NVM normal read access request (with access address RA4) and an NVM verify read request (with access address WA3) are received. In this case, the verify read request WA3 can be serviced by vfy rep cache 146. Therefore, a read from vfy rep cache 146 is enabled at time t7 to obtain the corresponding repair mapping information SD3, in which vfy_cache_sel[1:0] is set to 0x1 to perform a read from vfy_cache0[49:0]. In response, the value of SD3 stored in the vfy_cache0[49:0] (which corresponds to access address WA3, and was previously written into the cache at time t6) is provided as vfy_cache rdata[49:0] at time t8. SRAM 118 simultaneously services the normal read access from RA4. Therefore, at time t7, ce and re are asserted to perform a read from SRAM 118 from the corresponding portion (SA4) of the access address to obtain the corresponding repair mapping information (SD4) at time t8 (while the read access is occurring to vfy rep cache 146). Therefore, at time t8, in addition to SD3 provided as vfy_cache rdata[49:0] from vfy rep cache 146, SD4 is also provided as Q[49:0] from SRAM 118.

At time t9, an NVM normal read request with corresponding access address RA5 is received, which is serviced by SRAM 118 to provide the corresponding repair mapping information SD5 at time t10. At time t11, another NVM verify read access request from access address WA3 is received, which again is serviced by vfy rep cache 146, leaving SRAM 118 available to service normal read requests, as needed.

FIG. 6 illustrates various signals in access MRAM 100 and SRAM 118, in an example in which vfy rep cache 146 is present for SRAM 118 for use by repair circuitry 120, and arbitration is performed by cache arbiter 140. In addition to the signals illustrated in FIG. 5, the waveform of FIG. 6 also includes a read/write stall signal which, when asserted to a logic level high, indicates a bus stall for normal reads, as needed. Referring to FIG. 6, at time t1, an NVM normal read request with corresponding access address RA1 is received. At time t2, a portion of the corresponding access address is provided as the SRAM read access address SA1 to SRAM 118, and ce and re are asserted. At time t3, the corresponding repair mapping information SD1 is provided by SRAM 118 as Q[49:0].

At time t4, an NVM normal read access request with corresponding access address R2 is received. Later in the clock cycle, at time t5, a portion of the corresponding access address is provided as the SRAM read access address SA2 to SRAM 118. However, at time t5, an NVM write request with corresponding access address WA3 is also received. In the illustrated embodiment, it is assumed that cache arbiter 140 provides priority to the read access request over the write access request, since a write typically takes longer to service than a read. Therefore, at time t5, SA2 is provided onto A[6:0] and ce and re are asserted (until time t6), which results in a stall for SA3. As was described in reference to FIG. 8, at the initiation of the write request, a read access to SRAM 118 at SA3 is initiated to obtain the corresponding repair mapping information, SD3, for loading into vfy rep cache 146. Due to priority given to RA2 over WA3, though, this read access is stalled and SA3 is not provided on A[6:0] until time t7, after SA2 has been processed from A[6:0]. Also, ce and re are again asserted with SA3 on A[6:0]. Once SA3 is consumed from A[6:0] by SRAM 118, the stall of the write bus can be lifted at time t8. The corresponding repair mapping information SD3 is therefore not returned from SRAM 118 until time t9, upon completion of the read from SA3.

In this example, cache arbiter 140, upon receipt of both an NVM normal read request and an NVM write request, selected to service the normal read request first. In one embodiment, cache arbiter 140 always arbitrates reads over writes. However, in alternate embodiments, different factors may be used by cache arbiter 140 to arbitrate between simultaneous requests.

Still referring to FIG. 6, once the corresponding repair mapping information is provided by SRAM 118 (at time t9), it is also stored into a next available entry, vfy_cache0[49:0], of vfy rep cache 146 at time t10. In this manner, when a verify read request associated with the write request with corresponding access address WA3 is received at time t11, the corresponding repair mapping information can be provided from vfy rep cache 146. In the illustrated embodiment, at time t11, an NVM normal read request with corresponding access address RA4 is also received. However, no arbitration is required because the verify read request received at t11 is serviced by vfy rep cache 146 so that the normal read request can be serviced right away by SRAM 118, without requiring any bus stalls. Therefore, at time t12 vfy_cache_sel[1:0] is set to 0x1 such that the repair mapping information stored in vfy_cache0[49:0], SD3, is accessed and provided as vfy_cache rdata[49:0] at time t13. (Note that since an SRAM read access to load the cache is performed in response to initiation of a write operation, it is known that the corresponding repair mapping information should already be present in the vfy rep cache when needed for the verify reads of the write operation.) Access of the vfy rep cache is occurring at the same time as accessing the SRAM, therefore, at time t14, the corresponding mapping information SD4 is provided from SRAM 118 in response to the normal read request RA4.

Referring next to rd rep cache 142, FIG. 12 illustrates a method 400 for performing a normal read operation, in which column repair is implemented utilizing SRAM 118 and rd rep cache 148. Method 400 can be implemented and controlled by normal read control circuitry 128. For example, normal read control circuitry 128 can implement a state machine for these read operations. (Note that vfy rep cache 146 may also be present and used for verify reads, as was described above.) Method 400 begins with receiving a normal read request at block 402. Upon receiving the read request, a read access to SRAM 118 is made in parallel (i.e. simultaneously with) a read access to MRAM array 102. The read access to MRAM array 102 is performed as described, in which dout_rd[279:0] is returned at block 408. As described above, dout_rd[279:0] is the raw read data, which includes the user data, ECC data, and replacement I/O data. In block 404, an access to SRAM 118 is performed to retrieve repair mapping information (as Q[49:0]) corresponding to the read access address, and the received corresponding repair mapping information is stored into the next available entry of rd rep cache 142. Next, in block 406, when the corresponding repair mapping information is needed during the course of the read cycle, it is retrieved from rd rep cache 142 as rd_cache data[49:0] rather than being retrieved from SRAM 118.

After the read access to the MRAM of block 408, method 400 continues to block 410 in which the repair mapping information obtained from rd rep cache 142 (in block 406), is used to determine if column repair is enabled, and if so, replace the pertinent IOs with the corresponding replacement IOs. Since a read access to SRAM 118 and a subsequent access to rd rep cache 142 are faster than a read access to MRAM 100, the required repair mapping information for the MRAM read access is ensured to be available by the end of the MRAM read access (for block 410) Assuming ECC is used, ECC is performed on the selectively column-repaired read data at block 412. At this point, at block 414, the column-repaired and corrected read data (e.g. rdata[255:0]) is stored.

Figure 10:
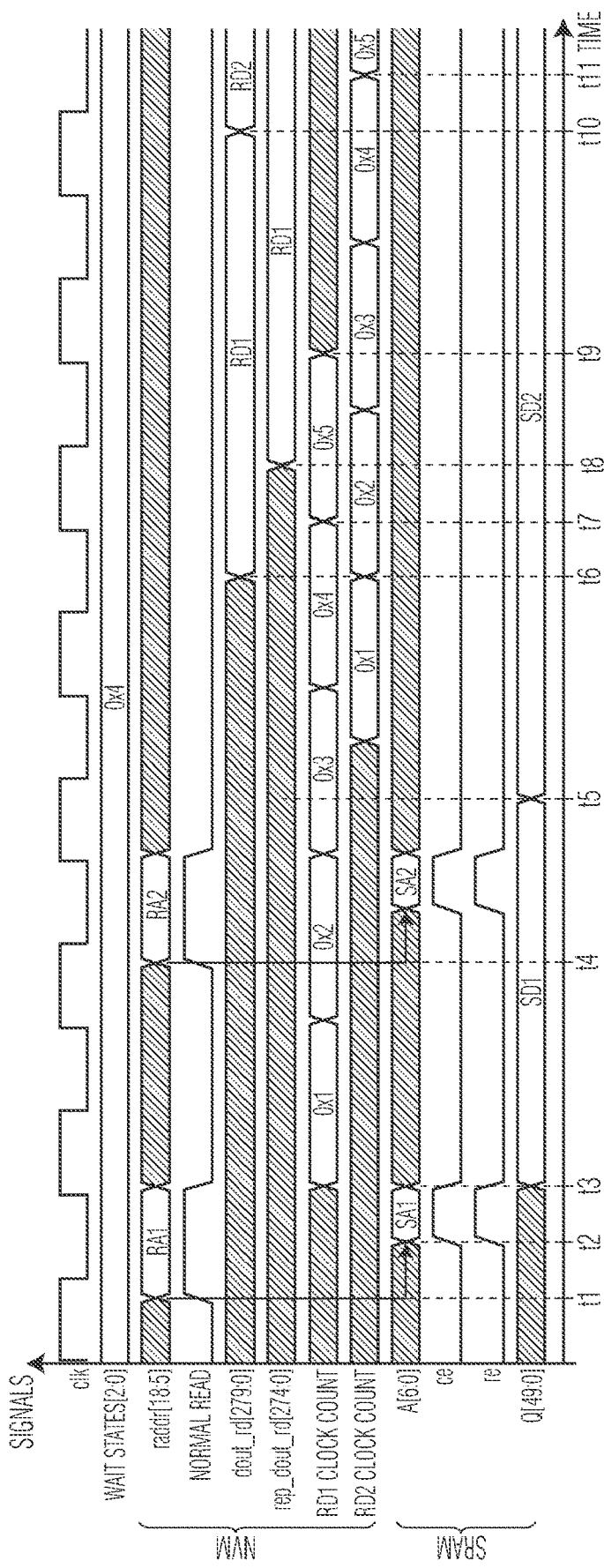
FIGS. 10-11 illustrate waveform diagrams of various signals of the NVM system of FIG. 1, in accordance with embodiments of the present invention.

FIG. 10 illustrates various signals in accessing MRAM 100 and SRAM 118, in an example in which there is no rd rep cache. In the illustrated embodiment, it is assumed that each normal read to the NVM (e.g. MRAM array 102) actually takes 5 clock cycles to complete (in which, in alternate embodiments, may take more or fewer cycles). The number of "wait states" in FIG. 10 is indicated as four (0x4), meaning that the raw read data from the NVM in response to a read access request will appear at the output of the NVM read circuit as, e.g. dout_rd[279:0], four clock cycles after the NVM read access address is placed on the read bus (e.g. raddr[18:5], from which the SRAM address A[6:0] is generated). The number of wait states can also vary, in which an NVM may include more or fewer wait states.

At time t1, a normal read access request with corresponding NVM read access address RA1 is received. As described above in reference to FIG. 12, in addition to initiating the read access to the NVM array by providing RA1 to the NVM, within the same clock cycle (at time t2), the appropriate portion SA1 of the read access address RA1 is provided as A[6:0] to SRAM 118 (and ce and re are asserted). At time t3, the RD1 clock count begins (corresponding to the first read at RA1) to count cycles of the clk signal, beginning with 0x1 at time t3, and sequentially counting up each clock cycle to 0x5 (at time t7). Also at time t3, the corresponding repair mapping information SD1 is returned as Q[49:0]. At time t3, a next normal read access request is received with a corresponding NVM read access address RA2. In the same clock cycle, the appropriate portion SA2 of RA2 is provided to SRAM 118 (and ce and re are again asserted). This read address is different from RA1 and therefore requires its own corresponding repair mapping information. In providing a next read access from SA2 to SRAM 118, the corresponding repair mapping information SD2 is returned as Q[49:0], overwriting SD1. Therefore, note that SD1 is no longer available as Q[49:0] at time t5. However, at four clock cycles after providing RA1 to the NVM, the corresponding raw read data, RD1, is received as dout_rd[279:0] at time t6.

As described above, for proper operation, col rep dout 122 requires the corresponding repair mapping information (SD1) to perform column repair on dout_rd[279:0] to provide rep dout_rd[274:0] to ECC decode 124 at time t8. However, at the time dout_rd[279:0] is ready for col rep dout 122 at time t6, SD1 is no longer valid as it was overwritten with SD2. In this situation, concurrent reads (multi-cycle reads with staggered start times), such as RA1 and RA2, causes inefficiencies in obtaining the repair mapping information in which extra accesses are needed to SRAM 118 or additional storage with additional timing control is needed in order to properly provide corresponding repair mapping information for multiple concurrent reads. Note that duplication of any of the circuitry and logic to provide this ability would be costly in both area and power.

Still referring to FIG. 10, at time t9, the five-cycle read access for RA1 completes. At time t10, after the RD2 clock count corresponding to the read access RA2 counts four, the raw read data RD2 corresponding to RA2 is ready as dout_rd[279:0]. In this case, the corresponding SD2 can be obtained from Q[49:0], assuming it has not been overwritten yet by a subsequent closely timed read access request (as illustrated in the example of FIG. 10).

Figure 11:
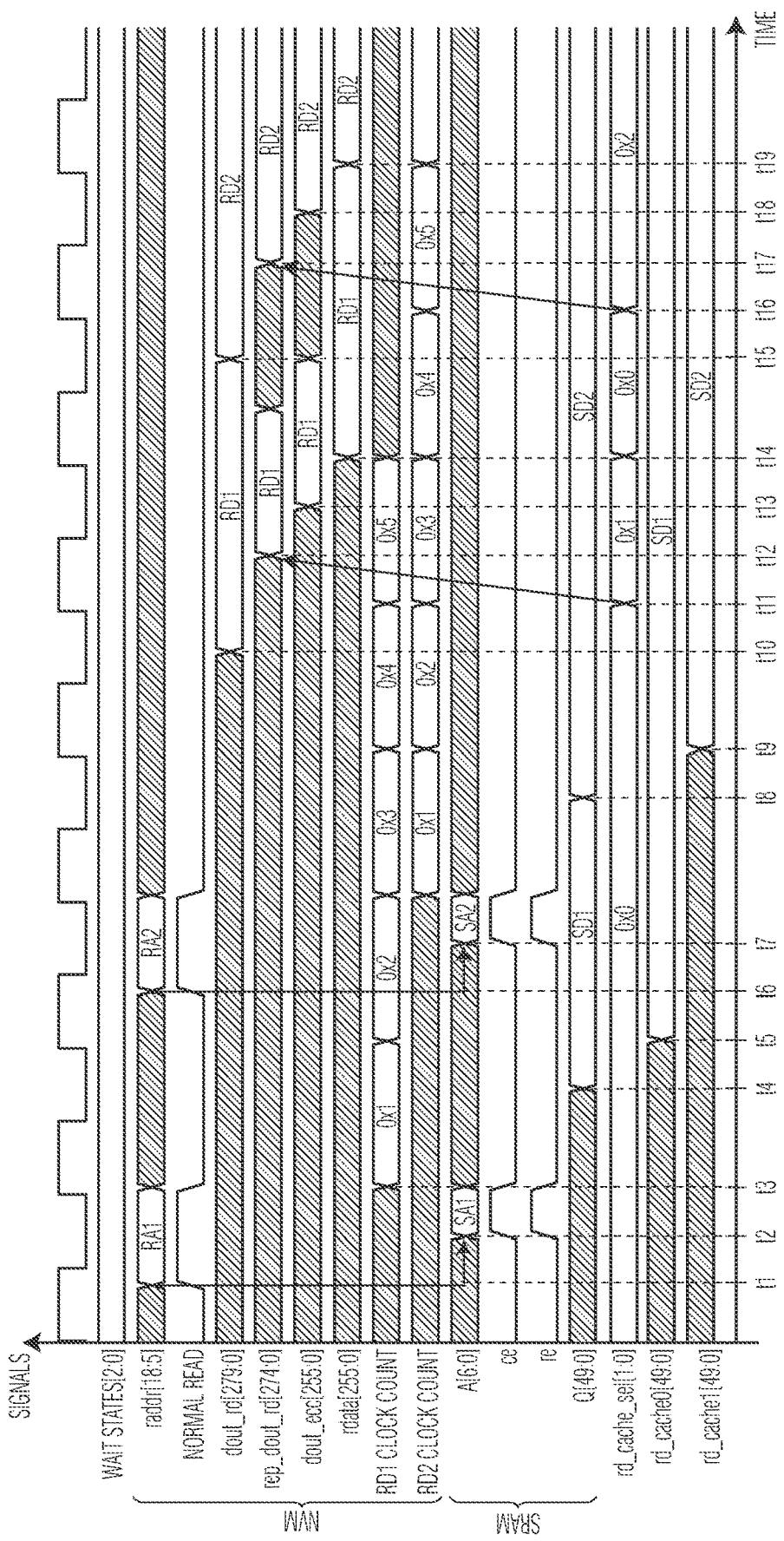

As will be seen in the example waveforms of FIG. 11, use of the rd rep cache allows repair mapping information to persist through the data phase of the read operation (when dout_rd[279:0] is ready for propagation through col rep dout 122 and ECC decode 124). The use of the cache enables a single data path (repair SRAM, col rep dout 122, ECC decode 124, to read buffer 126 which outputs the final read data as rdata[255:0]) to support multiple concurrent reads, without requiring duplication of any logic. FIG. 11 illustrates an example in which vfy rep cache 146 is present for SRAM 118 for use by repair circuitry 120. In addition to the signals illustrated in FIG. 10, the waveform of FIG. 11 also illustrates dout_ecc[255:0] (corresponding to the output of ECC decode 124) and signals for rd rep cache 142. In this embodiment, the signals rd_cache0[49:0] and rd_cache1[49:0] correspond to two data entries (i.e. two lines) of rd rep cache 142. The signals rd_cache_sel[1:0] operates analogously to vfy_cache_sel[1:0] described above. Also, as with vfy rep cache, rd rep cache 142 may include any number of entries, in which the corresponding select signal may include any number of bits, as needed.

Referring to FIG. 11, at time t1, a normal read access request is received with corresponding NVM read access address RA1 is received. As described above in reference to FIG. 12, in addition to initiating the read access to the NVM array by providing RA1 to the NVM, within the same clock cycle (at time t2), the appropriate portion SA1 of the read access address RA1 is provided as A[6:0] to SRAM 118 (and ce and re are asserted) so that the corresponding repair mapping information can be read from SRAM 118 and loaded into rd rep cache 142. At time t3, the RD1 clock count begins (corresponding to the first read at RA1) to count cycles of the clk signal, beginning with 0x1 at time t3, and sequentially counting up each clock cycle to 0x5 (at time t10). At time t4, the corresponding repair mapping information SD1 is returned as Q[49:0] from SRAM 118, and at time t5 it is stored into the next available entry of rd rep cache 142, e.g. rd_cache0[49:0].

At time t6, a next normal read access request is received with a corresponding NVM read access address RA2. In the same clock cycle, at time t7, the appropriate portion SA2 of RA2 is provided to SRAM 118 (and ce and re are again asserted). The corresponding repair mapping information SD2 is returned as Q[49:0] at time t8, overwriting SD1. However, SD1 remains stored in rd_cache0[49:0]. At time t9, SD2 is stored into a next available entry of rd rep cache 142, corresponding to rd_cache1[49:0]. Thus, both SD1 and SD2 are stored in the read repair cache. The corresponding raw read data, RD1, is received as dout_rd[279:0] at time t10 (which occurs after RD1 clock count has reached 0x4). In this situation, rd_cache_sel[1:0] is set to 0x1 at time t11, and col rep dout 122 receives the corresponding repair mapping information SD1 from rd_cache0[49:0] so as to perform column repair on dout_rd[279:0] and output rep dout_rd [274:0] to ECC decode 124 at time t12. At time t13, ECC decode 124 provides its repaired and ECC corrected output (dout_ecc[255:0]) which is stored in read buffer 126 and provided as rdata[255:0] at time t14 (which corresponds to the end of the multi-cycle read operation for RD1).

At time t15, the corresponding raw read data, RD2, for RA2 is received as dout_rd[279:0] from normal read circuitry 112 (which occurs after RD2 clock count has reached 0x4). In this situation, rd_cache_sel[1:0] is set to 0x2 at time t16, and col rep dout 122 receives the corresponding repair mapping information SD2 from rd_cache1[49:0] so as to perform column repair and output rep dout_rd[274:0] (corresponding to RD2 now) at time t17. At time t18, ECC decode 124 provides its repaired and ECC corrected output (dout_ecc[255:0]) which is stored in read buffer 126 and provided as rdata[255:0] at time t19 (which corresponds to the end of the multi-cycle read operation for RD2). In this manner, the read cache allows for multiple overlapping read accesses to timely access the corresponding mapping information at the appropriate stage of the read data path. In one embodiment, the multiple overlapping read access may correspond to a burst read access. Therefore, in one embodiment, the depth of rd rep cache 142 should be sufficient to provide an entry for each read access of a burst read.

With respect to the illustrated embodiment of FIG. 1, the NVM system is all located on a same integrated circuit, and may be a stand-alone memory or a memory embedded in the integrated circuit with other devices, such as a microcontroller, microprocessor, peripherals, other memories, etc. Since SRAM 118 of the NVM system is used to store repair mapping information for column replacement during read and write accesses to MRAM 100, SRAM 118 may be considered to be part of MRAM 100. The depth of each of the vfy rep cache and rd rep cache can have any number of entries, as needed, and can differ between the two caches. The size of each entry and organization of the entries can be designed differently, as needed, depending, for example, on the size and fields needed for the repair mapping information. Also, additional repair caches may be used for other transactions in addition to read, verify read, and write transactions.

Therefore, by now it can be appreciated how improved column/IO repair can be provided for an NVM (such as MRAM 100) with the use of an associated SRAM (such as SRAM 118) for storing repair mapping information for access addresses of MRAM 100 requiring column or 10 repair. Performance in providing the repair mapping information can be improved for those verify reads which are performed during a write operation through the use of a verify read repair cache, such as vfy rep cache 146. For example, upon initiation of a write operation, repair mapping information can be accessed from the associated SRAM and stored in the verify read repair cache such that the repair mapping information is readily available when needed by the verify reads of the write operation. In this manner, repair mapping information for normal read accesses can be obtained from the SRAM 118 with a reduced likelihood of SRAM contention with obtaining repair mapping information for read verify accesses. This repair mapping information can also advantageously be used during writes of the write operation subsequent to the verify reads. In one embodiment, a read repair cache can also be used such that repair mapping information can be loaded from the associated SRAM into the cache for each read of multiple overlapping normal reads. In this manner, subsequent access to the SRAM for loading the read repair cache can be performed while persistently storing the previously accessed repair mapping information in the read repair cache for later which may allow for more efficiently servicing overlapping read requests.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Although the invention has been described with respect to specific conductivity types or polarity of potentials, skilled artisans appreciated that conductivity types and polarities of potentials may be reversed.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Some of the above embodiments, as applicable, may be implemented using a variety of different architectures in a variety of different information processing systems. For example, although FIG. 1 and the discussion thereof describe an exemplary memory system architecture, this exemplary architecture is presented merely to provide a useful reference in discussing various aspects of the invention. Of course, the description of the architecture has been simplified for purposes of discussion, and it is just one of many different types of appropriate architectures that may be used in accordance with the invention. Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures can be implemented which achieve the same functionality.

Also for example, in one embodiment, the illustrated elements of system 100 are circuitry located on a single integrated circuit or within a same device. Furthermore, those skilled in the art will recognize that boundaries between the functionality of the above described operations merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Although the invention is described herein with reference to specific embodiments, various modifications and changes can be made without departing from the scope of the present invention as set forth in the claims below. For example, the NVM system of FIG. 1 can include other NVMs, such as a different disruptive NVM (other than MRAM) or a FLASH memory. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

The following are various embodiments of the present invention.

In one embodiment, a memory system includes a main memory which includes a first plurality of input/outputs (I/Os) configured to output data stored in the main memory in response to a read access request having a corresponding access address, wherein a first portion of the first plurality of IOs is configured to provide user read data in response to the read access request and a second portion of the first plurality of IOs is configured to provide candidate replacement IOs; and repair circuitry configured to selectively replace one or more IOs of the first portion of the first plurality of IOs using one or more of the candidate replacement IOs of the second portion of the first plurality of IOs to provide repaired read data in response to the read access request in accordance with repair mapping information corresponding to the corresponding access address. The memory system also includes a static random access memory (SRAM) separate from the main memory and configured to store repair mapping information corresponding to address locations of the main memory; and a repair cache configured to store cached repair mapping information from the SRAM for one or more address locations of the main memory, wherein the SRAM is a backing store for the repair cache. In one aspect of this embodiment, the first portion of the first plurality of IOs is configured to provide user read data and corresponding error correction data for the user read data in response to the read access request. In another aspect, the main memory is configured to receive verify read access requests and normal read access requests, and the first plurality of IOs is configured to output data stored in the main memory in response to the verify read access requests and not the normal read access requests, and the main memory further includes a second plurality of IOs configured to output data stored in the main memory in response to normal read access requests and not the verify read access requests. In another aspect, the read access request is characterized as a verify read access request, wherein the verify read access request is generated by the main memory as part of a write operation in the main memory, the write operation having a write access address, and the corresponding access address is the write access address. In a further aspect, the SRAM is configured to store repair mapping information corresponding to address locations of the main memory used as an access address for either verify reads, normal reads, or writes, and the repair cache is configured to only cache repair mapping information from the SRAM for verify reads or writes. In yet a further aspect, the repair circuitry is configured to, in response to initiation of the write operation, obtain corresponding repair mapping information for the access address from the SRAM and store the corresponding repair mapping information into an entry of the repair cache, and store write data corresponding to the write operation into a write buffer. In yet an even further aspect, the repair circuit is configured to, in response to the verify read access request, obtain the corresponding repair mapping information for the access address from the repair cache and not the SRAM, and use the corresponding repair mapping information to provide repaired read data in response to the read access request. In yet an even further aspect, an access address for the SRAM to store or obtain the corresponding repair mapping information is generated as a subset of the write access address. In another further aspect, the memory system further includes a second repair cache configured to store cached repair mapping information from the SRAM for one or more address locations of the main memory, wherein the SRAM is a backing store for the second repair cache, the second repair cache configured to only cache repair mapping information from the SRAM for normal reads. In a further aspect, the repair circuitry is configured to, in response to initiating a normal read request having a corresponding normal read access address, obtain corresponding repair mapping information for the normal read access address from the SRAM and store the corresponding repair mapping information for the normal read access address into an entry of the second repair cache, wherein responding to the normal read request requires a multiple clock cycle read operation in the main memory. In yet a further aspect, the repair circuitry is configured to, when read data from the main memory is available at a later clock cycle of the multiple clock cycle read operation, obtain the corresponding repair mapping information for the normal read access address from the second repair cache and not the SRAM to provide repaired read data in response to the normal read access request. In yet further aspect, the repair circuitry is configured to, in response to initiating a subsequent normal read request having a corresponding normal read access address prior to completing the multiple clock cycle read operation for the normal read request, obtain corresponding repair mapping information for the subsequent normal read access address from the SRAM and store the corresponding repair mapping information for the subsequent normal read access address into a second entry of the second repair cache, wherein the corresponding repair mapping information for the normal read access obtained from the SRAM is overwritten at an output of the SRAM with the corresponding repair mapping information for the subsequent normal read access prior to the later clock cycle of the multiple clock cycle read operation. In another further aspect, the access address for the SRAM to store or obtain the corresponding repair mapping information for the normal read access request is generated as a subset of the corresponding normal read access address. In another further aspect, the repair circuitry further includes a cache arbiter to arbitrate access to the SRAM from the repair cache and the second repair cache. In another aspect of this embodiment, the repair mapping information corresponding to the corresponding access address is configured to indicate, for each of the one or more candidate replacement IOs, whether or not the candidate replacement IO is enabled, and, when enabled, which IO of the first portion of the first plurality of IOs is to be replaced using the candidate replacement IO to provide the repaired read data in response to the read access request.

In another embodiment, a non-volatile memory (NVM) system includes an NVM includes a plurality of input/outputs (I/Os) configured to output data stored in the NVM in response to a verify read access request generated during a write operation having a corresponding write access address, wherein a first portion of the plurality of IOs is configured to provide user read data from the write access address in response to the verify read access request and a second portion of the plurality of IOs is configured to provide candidate replacement IOs; and repair circuitry configured to selectively replace one or more IOs of the first portion of the plurality of IOs using one or more of the candidate replacement IOs of the second portion of the plurality of IOs to provide repaired read data response to the verify read access request in accordance with repair mapping information corresponding to the corresponding write access address. The NVM system also includes a static random access memory (SRAM) configured to store repair mapping information corresponding to address locations of the NVM; and a verify read repair cache configured to store cached repair mapping information from the SRAM for one or more address locations of the NVM used to perform verify read operations during the write operation, wherein the SRAM is a backing store for the repair cache. In one aspect, the repair circuitry is configured to, after initiation of the write operation, obtain corresponding repair mapping information for the access address from the SRAM and store the corresponding repair mapping information into an entry of the repair cache, and store write data corresponding to the write operation into a write buffer, wherein the write data is subsequently written from the write buffer to the NVM by using the corresponding repair mapping information for the access address obtained from the repair cache and not the SRAM to provide repaired write data for storage to the NVM. In yet a further aspect, the repair circuitry is configured to, in response to the verify read access request, obtain the corresponding repair mapping information for the access address from the repair cache and not the SRAM, and use the corresponding repair mapping information to provide repaired read data in response to the read access request.

In yet another embodiment, a non-volatile memory (NVM) system includes an NVM which includes a plurality of input/outputs (I/Os) configured to output data stored in the NVM in response to an NVM read access request having a corresponding access address, wherein a first portion of the plurality of IOs is configured to provide user read data from the access address of the NVM in response to the NVM read access request and a second portion of the plurality of IOs is configured to provide candidate replacement IOs, wherein the NVM read access request requires a multiple cycle read operation in the NVM to complete; and repair circuitry configured to selectively replace one or more IOs of the first portion of the plurality of IOs using one or more of the candidate replacement IOs of the second portion of the plurality of IOs to provide in repaired read data response to the NVM read access request in accordance with repair mapping information corresponding to the corresponding access address. The NVM system also includes a static random access memory (SRAM) configured to store repair mapping information corresponding to address locations of the NVM; and a read repair cache configured to store cached repair mapping information from the SRAM for one or more address locations of the NVM used to perform overlapping multiple-cycle read operations, wherein the SRAM is a backing store for the repair cache. In one aspect, the repair circuitry is configured to, in response to initiating the NVM read access request, obtain corresponding repair mapping information for the corresponding read access address from the SRAM and store the corresponding repair mapping information for the corresponding read access address into an entry of the repair cache, and when raw read data, including user read data and replacement data, for the NVM read access request from the main memory is available on the plurality of IOs at a later clock cycle of the multiple clock cycle read operation, obtain the corresponding repair mapping information for the NVM read access address from the repair cache and not the SRAM to provide repaired read data in response to the NVM read access request.

What is claimed is:

1. A memory system, comprising:
    a main memory comprising:
        a first plurality of input/outputs (I/Os) configured to output data stored in the main memory in response to a read access request having a corresponding access address, wherein a first portion of the first plurality of IOs is configured to provide user read data in response to the read access request and a second portion of the first plurality of IOs is configured to provide candidate replacement IOs; and
        repair circuitry configured to selectively replace one or more IOs of the first portion of the first plurality of IOs using one or more of the candidate replacement IOs of the second portion of the first plurality of IOs to provide repaired read data in response to the read access request in accordance with repair mapping information corresponding to the corresponding access address;
    a static random access memory (SRAM) separate from the main memory and configured to store repair mapping information corresponding to address locations of the main memory; and
    a repair cache configured to store cached repair mapping information from the SRAM for one or more address locations of the main memory, wherein the SRAM is a backing store for the repair cache.

2. The memory system of claim 1, wherein the first portion of the first plurality of IOs is configured to provide user read data and corresponding error correction data for the user read data in response to the read access request.

3. The memory system of claim 1, wherein the main memory is configured to receive verify read access requests and normal read access requests, and the first plurality of IOs is configured to output data stored in the main memory in response to the verify read access requests and not the normal read access requests, the main memory further comprising:
    a second plurality of IOs configured to output data stored in the main memory in response to normal read access requests and not the verify read access requests.

4. The memory system of claim 1, wherein the read access request is characterized as a verify read access request, wherein the verify read access request is generated by the main memory as part of a write operation in the main memory, the write operation having a write access address, and the corresponding access address is the write access address.

5. The memory system of claim 4, wherein the SRAM is configured to store repair mapping information corresponding to address locations of the main memory used as an access address for either verify reads, normal reads, or writes, and the repair cache is configured to only cache repair mapping information from the SRAM for verify reads or writes.

6. The memory system of claim 5, wherein the repair circuitry is configured to, in response to initiation of the write operation:
    obtain corresponding repair mapping information for the access address from the SRAM and store the corresponding repair mapping information into an entry of the repair cache, and
    store write data corresponding to the write operation into a write buffer.

7. The memory system of claim 6, wherein the repair circuit is configured to, in response to the verify read access request, obtain the corresponding repair mapping information for the access address from the repair cache and not the SRAM, and use the corresponding repair mapping information to provide repaired read data in response to the read access request.

8. The memory system of claim 7, wherein an access address for the SRAM to store or obtain the corresponding repair mapping information is generated as a subset of the write access address.

9. The memory system of claim 5, further comprising a second repair cache configured to store cached repair mapping information from the SRAM for one or more address locations of the main memory, wherein the SRAM is a backing store for the second repair cache, the second repair cache configured to only cache repair mapping information from the SRAM for normal reads.

10. The memory system of claim 9, wherein the repair circuitry is configured to, in response to initiating a normal read request having a corresponding normal read access address:
    obtain corresponding repair mapping information for the normal read access address from the SRAM and store the corresponding repair mapping information for the normal read access address into an entry of the second repair cache, wherein responding to the normal read request requires a multiple clock cycle read operation in the main memory.

11. The memory system of claim 10, wherein the repair circuitry is configured to, when read data from the main memory is available at a later clock cycle of the multiple clock cycle read operation, obtain the corresponding repair mapping information for the normal read access address from the second repair cache and not the SRAM to provide repaired read data in response to the normal read access request.

12. The memory system of claim 11, wherein the repair circuitry is configured to, in response to initiating a subsequent normal read request having a corresponding normal read access address prior to completing the multiple clock cycle read operation for the normal read request:
obtain corresponding repair mapping information for the subsequent normal read access address from the SRAM and store the corresponding repair mapping information for the subsequent normal read access address into a second entry of the second repair cache,
wherein the corresponding repair mapping information for the normal read access obtained from the SRAM is overwritten at an output of the SRAM with the corresponding repair mapping information for the subsequent normal read access prior to the later clock cycle of the multiple clock cycle read operation.

13. The memory system of claim 10, wherein the access address for the SRAM to store or obtain the corresponding repair mapping information for the normal read access request is generated as a subset of the corresponding normal read access address.

14. The memory system of claim 9, wherein the repair circuitry further comprises a cache arbiter to arbitrate access to the SRAM from the repair cache and the second repair cache.

15. The memory system of claim 1, wherein the repair mapping information corresponding to the corresponding access address is configured to indicate:
for each of the one or more candidate replacement IOs, whether or not the candidate replacement IO is enabled, and, when enabled, which IO of the first portion of the first plurality of IOs is to be replaced using the candidate replacement IO to provide the repaired read data in response to the read access request.

16. A non-volatile memory (NVM) system, comprising:
an NVM comprising:
a plurality of input/outputs (I/Os) configured to output data stored in the NVM in response to a verify read access request generated during a write operation having a corresponding write access address, wherein a first portion of the plurality of IOs is configured to provide user read data from the write access address in response to the verify read access request and a second portion of the plurality of IOs is configured to provide candidate replacement IOs; and
repair circuitry configured to selectively replace one or more IOs of the first portion of the plurality of IOs using one or more of the candidate replacement IOs of the second portion of the plurality of IOs to provide repaired read data response to the verify read access request in accordance with repair mapping information corresponding to the corresponding write access address;
a static random access memory (SRAM) configured to store repair mapping information corresponding to address locations of the NVM; and
a verify read repair cache configured to store cached repair mapping information from the SRAM for one or more address locations of the NVM used to perform verify read operations during the write operation, wherein the SRAM is a backing store for the repair cache.

17. The NVM system of claim 16, wherein the repair circuitry is configured to,
after initiation of the write operation:
obtain corresponding repair mapping information for the access address from the SRAM and store the corresponding repair mapping information into an entry of the repair cache, and
store write data corresponding to the write operation into a write buffer, wherein the write data is subsequently written from the write buffer to the NVM by using the corresponding repair mapping information for the access address obtained from the repair cache and not the SRAM to provide repaired write data for storage to the NVM.

18. The NVM system of claim 17, wherein the repair circuitry is configured to, in response to the verify read access request:
obtain the corresponding repair mapping information for the access address from the repair cache and not the SRAM, and use the corresponding repair mapping information to provide repaired read data in response to the read access request.

19. A non-volatile memory (NVM) system, comprising:
an NVM comprising:
a plurality of input/outputs (I/Os) configured to output data stored in the NVM in response to an NVM read access request having a corresponding access address, wherein a first portion of the plurality of IOs is configured to provide user read data from the access address of the NVM in response to the NVM read access request and a second portion of the plurality of IOs is configured to provide candidate replacement IOs, wherein the NVM read access request requires a multiple cycle read operation in the NVM to complete; and
repair circuitry configured to selectively replace one or more IOs of the first portion of the plurality of IOs using one or more of the candidate replacement IOs of the second portion of the plurality of IOs to provide in repaired read data response to the NVM read access request in accordance with repair mapping information corresponding to the corresponding access address;
a static random access memory (SRAM) configured to store repair mapping information corresponding to address locations of the NVM; and
a read repair cache configured to store cached repair mapping information from the SRAM for one or more address locations of the NVM used to perform overlapping multiple-cycle read operations, wherein the SRAM is a backing store for the repair cache.

20. The NVM system of claim 19, wherein the repair circuitry is configured to,
in response to initiating the NVM read access request, obtain corresponding repair mapping information for the corresponding read access address from the SRAM and store the corresponding repair mapping information for the corresponding read access address into an entry of the repair cache, and
when raw read data, including user read data and replacement data, for the NVM read access request from the main memory is available on the plurality of IOs at a later clock cycle of the multiple clock cycle read operation, obtain the corresponding repair mapping information for the NVM read access address from the repair cache and not the SRAM to provide repaired read data in response to the NVM read access request.

\* \* \* \* \*